US010361319B2

(12) United States Patent
Cantoro et al.

(10) Patent No.: US 10,361,319 B2
(45) Date of Patent: Jul. 23, 2019

(54) INTEGRATED CIRCUIT DEVICES

(71) Applicant: SAMSUNG ELECTRONICS CO., LTD., Suwon-si, Gyeonggi-do (KR)

(72) Inventors: Mirco Cantoro, Suwon-si (KR); Yeon-cheol Heo, Suwon-si (KR); Maria Toledano Luque, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/981,578

(22) Filed: May 16, 2018

(65) Prior Publication Data

US 2018/0269333 A1 Sep. 20, 2018

Related U.S. Application Data

(63) Continuation of application No. 15/598,675, filed on May 18, 2017, now Pat. No. 9,978,881.

(30) Foreign Application Priority Data

Aug. 5, 2016 (KR) .................. 10-2016-0100124

(51) Int. Cl.
  *H01L 29/786* (2006.01)
  *H01L 21/8238* (2006.01)
  (Continued)

(52) U.S. Cl.
  CPC .......... *H01L 29/78696* (2013.01); *H01L 21/823807* (2013.01); *H01L 21/823814* (2013.01); *H01L 21/823828* (2013.01); *H01L 21/823878* (2013.01); *H01L 21/823885* (2013.01); *H01L 27/092* (2013.01); *H01L 29/42392* (2013.01); *H01L 29/78609* (2013.01); *H01L 29/78618* (2013.01); *H01L 29/78642* (2013.01)

(58) Field of Classification Search
  CPC . H01L 29/78; H01L 29/786; H01L 29/78609; H01L 29/78642; H01L 29/78618; H01L 29/423; H01L 29/42392; H01L 29/78696; H01L 27/092
  USPC ........................................... 257/329
  See application file for complete search history.

(56) References Cited

U.S. PATENT DOCUMENTS 6,828,580 B2  12/2004 Zhang
7,791,108 B2  9/2010 Hurkx et al.
(Continued)

FOREIGN PATENT DOCUMENTS

JP  2009-524924 A  7/2009
KR  10-1377068 B1  3/2014

*Primary Examiner* — Chuong A Luu
(74) *Attorney, Agent, or Firm* — Lee & Morse, P.C.

(57) ABSTRACT

An integrated circuit device includes a substrate, first and second fin active regions formed on the substrate and extending in a first direction parallel to a top surface of the substrate, a first gate structure disposed on a side surface of the first fin active region, a pair of first impurity regions respectively formed on a top portion and a bottom portion of the first fin active region, a second gate structure disposed on a side surface of the second fin active region, and a pair of second impurity regions respectively formed on a top portion or a bottom portion of the second fin active region, wherein the pair of first impurity regions vertically overlap each other, and the pair of second impurity regions do not vertically overlap each other.

20 Claims, 26 Drawing Sheets

(51) Int. Cl.
*H01L 27/092* (2006.01)
*H01L 29/423* (2006.01)

(56) References Cited

U.S. PATENT DOCUMENTS

| | | |
|---|---|---|
| 8,115,243 B2 | 2/2012 | Forbes |
| 8,866,214 B2 | 10/2014 | Guo et al. |
| 9,306,063 B2 | 4/2016 | Doyle et al. |
| 2013/0093000 A1 | 4/2013 | Guo et al. |
| 2014/0008606 A1 | 1/2014 | Hussain et al. |
| 2016/0190142 A1* | 6/2016 | Kim ................ H01L 21/823807 438/231 |
| 2018/0012765 A1* | 1/2018 | Wang .................. H01L 29/4236 |

* cited by examiner great circuit device according to example embodiments;

INTEGRATED CIRCUIT DEVICES

CROSS-REFERENCE TO RELATED APPLICATIONS

This is a continuation application based on pending application Ser. No. 15/598,675, filed May 18, 2017, the entire contents of which is hereby incorporated by reference.

Korean Patent Application No. 10-2016-0100124, filed on Aug. 5, 2016, in the Korean Intellectual Property Office, and entitled: "Integrated Circuit Devices and Method of Manufacturing the Same," is incorporated by reference herein in its entirety.

BACKGROUND

1. Field

Embodiments relate to an integrated circuit device and a method of manufacturing the integrated circuit device.

2. Description of the Related Art

As electronic devices become light, thin, and compact, the demand for highly integrated semiconductor devices increases.

SUMMARY

Embodiments are directed to an integrated circuit device including: first and second fin active regions formed on a substrate and extending in a first direction parallel to a top surface of the substrate; a first gate structure disposed on a side surface of the first fin active region; a pair of first impurity regions respectively formed on a top portion and a bottom portion of the first fin active region; a second gate structure disposed on a side surface of the second fin active region; and a pair of second impurity regions respectively formed on a top portion or a bottom portion of the second fin active region, wherein the pair of first impurity regions vertically overlap each other, and the pair of second impurity regions do not vertically overlap each other.

Embodiments are also directed to an integrated circuit device including a substrate including first and second fin active regions; a first transistor formed on the substrate, the first transistor including a first gate structure formed on a side surface of the first fin active region and a pair of first impurity regions formed in a top portion and a bottom portion of the first fin active region; and a second transistor formed on the substrate, the second transistor including a second gate structure formed on a side surface of the second fin active region and having a same height as the first gate structure and a pair of second impurity regions formed in a top portion or a bottom portion of the second fin active region, wherein an effective channel length of the second transistor is longer than an effective channel length of the first transistor.

Embodiments are also directed to an integrated circuit device including first and second fin active regions formed on a substrate and extending in a first direction parallel to a top surface of the substrate, a first gate structure disposed on a side surface of the first fin active region, an upper first impurity region disposed above the first gate structure, and a lower first impurity region disposed below the first gate structure of the first fin active region, and a second gate structure disposed on a side surface of the second fin active region, an upper second impurity region disposed above the second gate structure, and a lower second impurity region disposed below the second gate structure of the second fin active region. A distance between closest points of the upper and lower second impurity regions may be greater than a distance between closest points of the upper and lower first impurity regions.

BRIEF DESCRIPTION OF THE DRAWINGS

Features will become apparent to those of skill in the art by describing in detail example embodiments with reference to the attached drawings in which.

DETAILED DESCRIPTION

Figure 1:
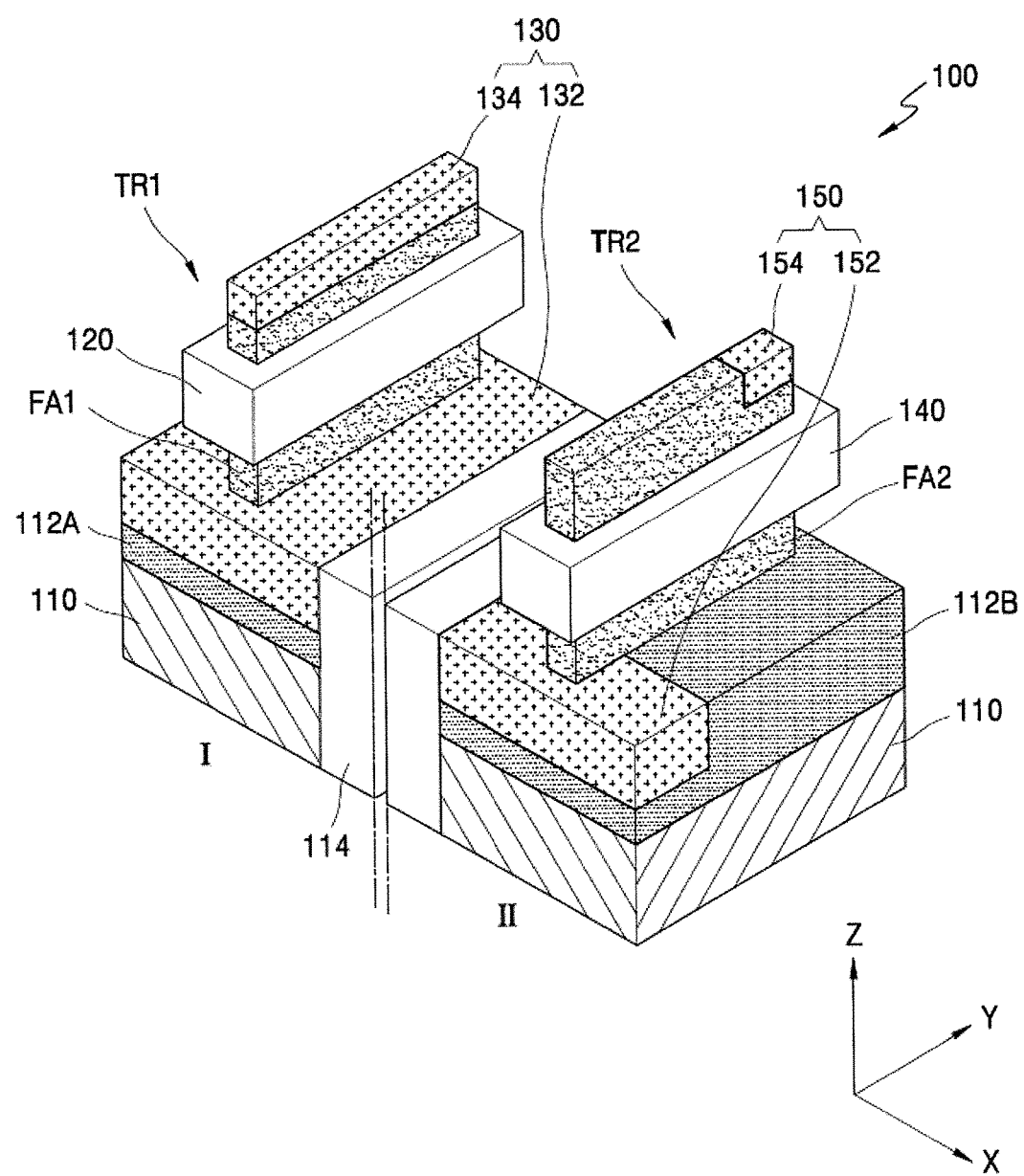
FIG. 1 illustrates a perspective view illustrating an integrated circuit device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
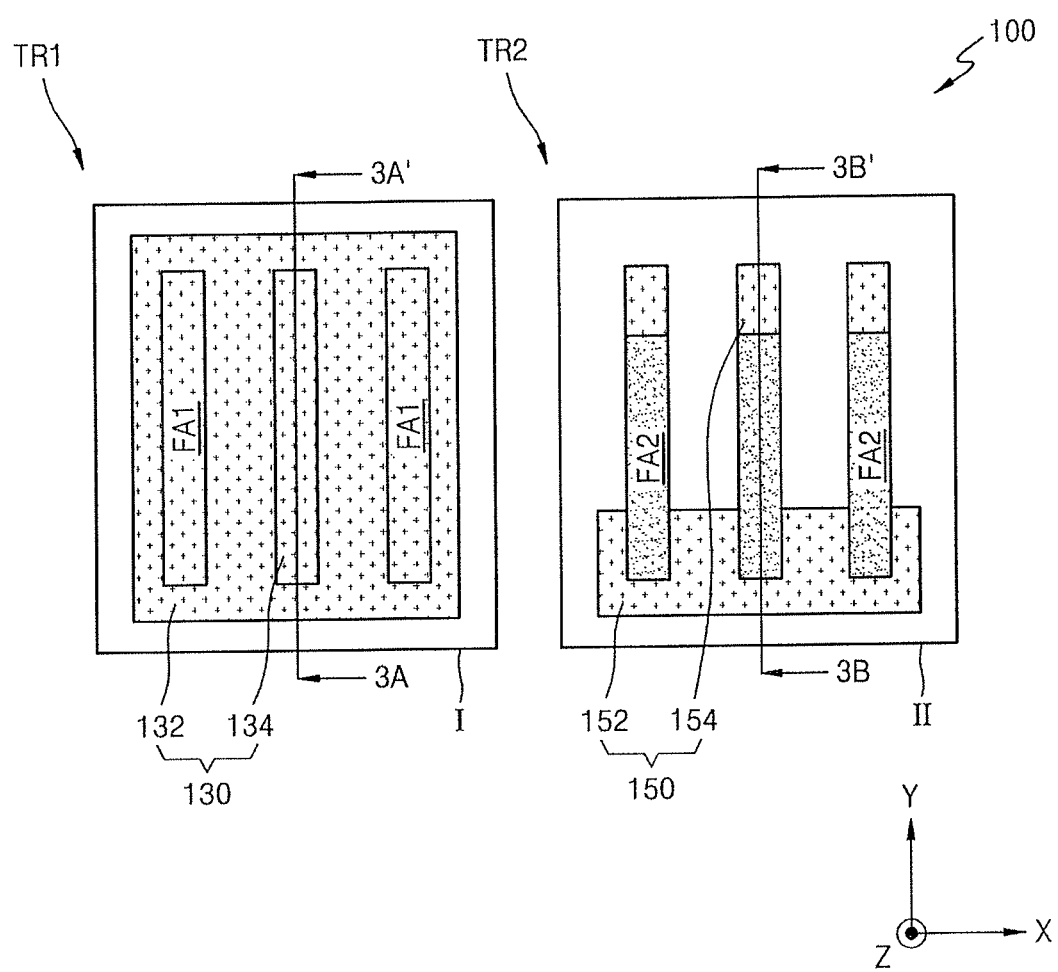
FIG. 2 illustrates a plan view of the integrated circuit device of FIG. 1.
Figure 3:
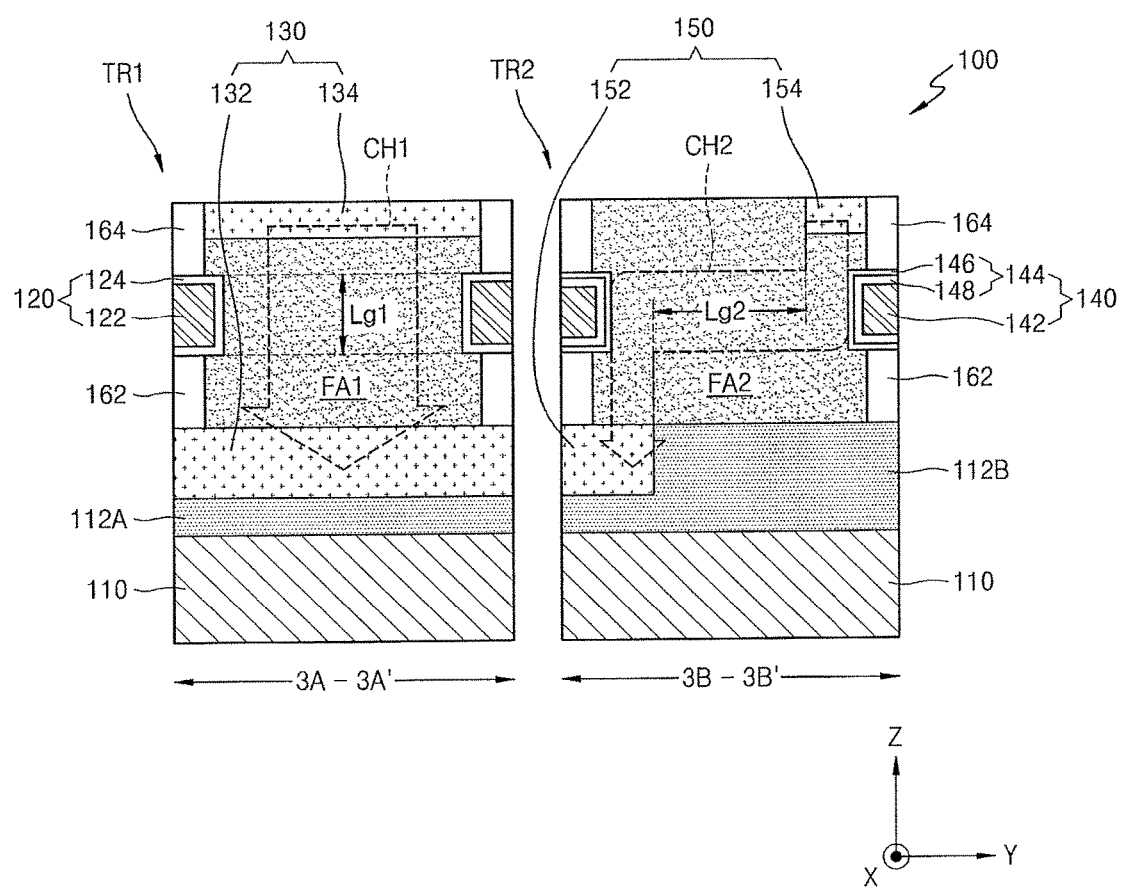
FIG. 3 illustrates a cross-sectional view of the integrated circuit device of FIG. 2 cut along a line 3A-3A' and a line 3B-3B' of FIG. 2.

FIG. 1 is a perspective view illustrating an integrated circuit device 100 according to example embodiments. FIG. 2 is a plan view of the integrated circuit device 100 of FIG. 1, and FIG. 3 is a cross-sectional view of the integrated circuit device 100 cut along a line 3A-3A' and a line 3B-3B' of FIG. 2. In FIGS. 1 and 2, some elements of the integrated circuit device 100, for example, first and second insulation layers 162 and 164, may be omitted for convenience of illustration.

Referring to FIGS. 1 through 3, the integrated circuit device 100 may include a first transistor TR1 and a second transistor TR2 formed on a substrate 110.

The substrate 110 may include a first region I and a second region II defined by an isolation layer 114. The first region I and the second region II may be active regions in which different types of transistors, to which operating voltages of different amplitudes are applied, are disposed. For example, the first region I may be a high-voltage region in which a high-voltage transistor, to which a relatively high operating voltage is applied, may be formed. The second region II may be a low-voltage region in which a low-voltage transistor, to which a relatively low operating voltage is applied, may be formed. For example, an operating voltage of about 1 V or higher may be applied to the first region I, and an operating voltage lower than about 1 V may be applied to the second region II.

In an example embodiment, the first region I and the second region II may be active regions in which different types of logic cells are formed. For example, the first region I may be a core region in which logic devices are disposed, and the second region II may be an I/O device region in which input/output interface devices, through which a signal from an external circuit or power is supplied to the logic devices in the first region I, are disposed.

First and second fin active regions FA1 and FA2 may be formed in the first region I and the second region II, respectively. The first and second fin active regions FA1 and FA2 may extend in a first direction (Y-direction in FIG. 1) parallel to a top surface of the substrate 110 and protrude along a third direction (Z direction of FIG. 1) perpendicular to the top surface of the substrate 110. In FIG. 2, for example, three first fin active regions FA1 are spaced apart from one another in the first region I, and three second fin active region FA2 are spaced apart from one another in the second region II. However, the number of first and second fin active regions FA1 and FA2 respectively disposed in the first and second regions I and II that are separated by the isolation layer 114 is not limited to that illustrated in FIG. 2. For convenience of description, an inner portion of the substrate 110 disposed below the first fin active region FA1 up to a predetermined depth in the first region I will be referred to as a bottom portion of the first fin active region FA1. Accordingly, the three first fin active regions FA1 adjacent to one another in the first region I may share a bottom portion of the substrate 110. Similarly, an inner portion of the substrate 110 disposed below the second fin active region FA2 up to a predetermined depth in the second region II will be referred to as a bottom portion of the second fin active region FA2.

A first well region 112A and a second well region 112B may be formed in the first region I and the second region II of the substrate 110, respectively. The first well region 112A and the second well region 112B may be doped with impurities at a high concentration. For example, when an NMOS transistor is formed in the first region I and the second region II of the substrate 110, the first and second well regions 112A and 112B may be p-type impurity doped regions. As another example, when a PMOS transistor is formed in the first region I and the second region II of the substrate 110, the first and second regions 112A and 112B may be n-type impurity-doped regions.

The first transistor TR1 may be formed on the first region I of the substrate 110. The first transistor TR1 may include a first gate structure 120 disposed on sidewalls of the first fin active region FA1 and a pair of first impurity regions 130 disposed on a top portion and a bottom portion of the first fin active region FA1.

The first gate structure 120 may be disposed to surround sidewalls of the first fin active region FA1. As illustrated in FIG. 1, when the first fin active region FA1 is a rectangular parallelepiped having a pair of long sidewalls extending in the first direction (Y direction) and a pair of short sidewalls extending in a second direction (X direction), the first gate structure 120 contacts all four sidewalls of the first fin active region FA1 and surrounds the first fin active region FA1. Thus, the first transistor TR1 may also be referred to as a gate-all-around transistor. However, the form of the first fin active region FA1 is not limited to that illustrated in FIG. 1. A cross-section of the first fin active region FA1 cut along an X-Y plane (for example, a vertical cross-section) may have, for example, a square shape, an oval shape, or a rectangular shape having rounded corners.

The first gate structure 120 may include a first gate electrode 122 and a first gate insulation layer 124. The first gate electrode 122 may be disposed to surround the sidewalls of the first fin active region FA1. In an example embodiment, the first gate electrode 122 may have a structure in which a metal nitride layer and a gap-fill metal layer are sequentially stacked. The metal nitride layer may include a nitride of, for example, one or more metals selected from Ti, Ta, W, Ru, Mb, Mo, and Hf. The metal nitride layer may be formed using, for example, an atomic layer deposition (ALD) process, a metal organic ALD (MOALD) process, or a metal organic chemical vapor deposition (MOCVD) process. The gap-fill metal layer may include, for example, a tungsten (W) layer, and using a process such as an ALD process, a CVD process, or a physical vapor deposition (PVD) process.

The first gate insulation layer 124 may be between the first fin active region FA1 and the first gate electrode 122, and may be disposed to surround the sidewalls of the first fin active region FA1. As illustrated in FIG. 3, the first gate insulation layer 124 may be formed on all of a top surface, a bottom surface, and a lateral surface of the first gate electrode 122. In another example, the first gate insulation layer 124 may be disposed only between the first gate electrode 122 and the first fin active region FA1.

In an example embodiment, the first gate insulation layer 124 may be a high-k dielectric layer formed of a material having a higher dielectric constant than silicon oxide. For example, the first gate insulation layer 124 may have a dielectric constant of about 10 to about 25. The high-k dielectric layer may be formed of, for example, one or more of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. The first gate insulation layer 124 may be formed using, for example, an ALD process, a CVD process, or a PVD process. The first gate insulation layer 124 may have a thickness of, for example, about 10 Å to about 50 Å.

The pair of first impurity regions 130 may include a first bottom impurity region 132 and a first top impurity region 134. The pair of first impurity regions 130 may act as a source/drain region of the first transistor TR1.

The first bottom impurity region 132 may be disposed to vertically overlap the entire area of the first fin active region FA1, and may be formed, for example, by ion-implanting a first conductivity type impurity into substantially the entire area of the bottom portion of the first fin active region FA1.

The first top impurity region 134 may be disposed to vertically overlap the entire area of the first fin active region FA1, and may be formed, for example, by ion-implanting a first conductivity type impurity into substantially the entire area of the top portion of the first fin active region FA1. As illustrated in FIG. 3, for example, the first bottom impurity region 132 and the first top impurity region 134 may be disposed to overlap each other in a vertical direction (Z direction).

In an example embodiment, when the first transistor TR1 is an NMOS transistor, the first conductivity type may be n-type, and the first bottom impurity region 132 and the first top impurity region 134 may include n-type impurities. In another example, when the first transistor TR1 is a PMOS transistor, the first conductivity type may be p-type, and the first bottom impurity region 132 and the first top impurity region 134 may include p-type impurities.

The second transistor TR2 may be formed on the second region II of the substrate 110. The second transistor TR2 may include a second gate structure 140 disposed on sidewalls of the second fin active region FA2, and a pair of second impurity regions 150 disposed on portions of a top portion and a bottom portion of the second fin active region FA2.

The second gate structure 140 may be disposed to surround sidewalls of the second fin active region FA2. The second gate structure 140 may include a second gate electrode 142 and a second gate insulation layer 144. As illustrated in FIG. 3, the second gate structure 140 may have a vertical length that is substantially the same as that of the first gate structure 120. An example process of forming the first and second gate structures 120 and 140 may include forming a structure in which the first insulation layer 162, a sacrificial layer, and the second insulation layer 164 are sequentially stacked, and then the first gate structure 120 and the second gate structure 140 may be formed in a space that is left after removing the sacrificial layer. Accordingly, the first and second gate structures 120 and 140 may have substantially the same height in a vertical direction.

The second gate electrode 142 may be disposed to surround sidewalls of the second fin active region FA2. The second gate electrode 142 may be similar to the first gate electrode 122 of the first gate structure 120 described above, and thus descriptions thereof may not be repeated.

The second gate insulation layer 144 may be disposed between the second fin active region FA2 and the second gate electrode 142, and the second gate insulation layer 144 may include an interface layer 146 contacting the second fin active region FA2 and a high-k dielectric layer 148 on the interface layer 146. For example, the interface layer 146 may include a silicon oxide layer or a silicon oxynitride layer. The interface layer 146 may have a thickness of, for example, about 1 Å to about 50 Å. The interface layer 146 may be formed using, for example, a thermal oxidization process, an ALD process, or a CVD process. The high-k dielectric layer 148 may be formed of a material having a higher dielectric constant than silicon oxide and may include the same material as that included in the first gate insulation layer 124. The high-k dielectric layer 148 may be formed together in a process of forming the first gate insulation layer 124, and accordingly, the high-k dielectric layer 148 may have substantially the same or similar thickness as the first gate insulation layer 124. The high-k dielectric layer 148 may be similar to the first gate insulation layer 124, and thus descriptions thereof may not be repeated.

The pair of second impurity regions 150 may include a second bottom impurity region 152 and a second top impurity region 154. The pair of second impurity regions 150 may function as a source/drain region of the second transistor TR2.

The second bottom impurity region 152 may be disposed to vertically overlap a partial area of the second fin active region FA2. For example, the second bottom impurity region 152 may be formed by ion-implanting a first conductivity type impurity into a partial area of the bottom portion of the second fin active area FA2. As illustrated in FIG. 2, the second bottom impurity region 152 may be formed on a side portion of the bottom portion of the second fin active region FA2 extending in the first direction (Y direction).

The second top impurity region 154 may be disposed to vertically overlap a partial area of the second fin active region FA2, and may be offset in a lateral direction. In an example embodiment, the second top impurity region 154 may be disposed so as not to vertically overlap the second bottom impurity region 152. As illustrated in FIG. 2, the second top impurity region 154 may be formed on another side portion of the top portion of the second fin active region FA2 extending in the first direction (Y direction). Accordingly, along an X-Y plane, the second bottom impurity region 152 and the second top impurity region 154 may be spaced apart from each other in the first direction (Y direction). The second top impurity region 154 may be formed by, for example, ion-implanting a first conductivity type impurity into a partial area of the top portion of the second fin active region FA2.

The first insulation layer 162 may be disposed on the first and second regions I and II and surround lower portions of the sidewalls of the first and second fin active regions FA1 and FA2. The second insulation layer 164 may be disposed on the first and second gate structures 120 and 140 and surround top portions of the sidewalls of the first and second fin active regions FA1 and FA2. The first and second insulation layers 162 and 164 may be formed of, for example, silicon nitride ($Si_3N_4$), silicon oxynitride (SiON), carbon-containing silicon oxynitride (SiCON), or a combination thereof. In another example, the first and second insulation layers 162 and 164 may include a layer selected from tetra ethyl ortho silicate (TEOS) layer or an ultra-low k (ULK) layer having an ultra-low dielectric constant of about 2.2 to about 2.4, for example, one of a SiOC layer and a SiCOH layer.

In FIG. 3, an example channel path CH1 that may be formed in the first transistor TR1 and an example channel path CH2 that may be formed in the second transistor TR2 are illustrated by dashed arrows.

In the first transistor TR1, the pair of first impurity regions 130 may be disposed to vertically overlap the entire area of the first fin active region FA1, and accordingly, carriers such as electrons or holes may move, for example, from the first top impurity region 134 to the first bottom impurity region 132 (or in the opposite direction) in a vertical direction (Z direction) in the first transistor TR1. For example, a channel may be formed along a vertical direction in the first fin active region FA1. In this case, an effective channel length Lg1 of the first transistor TR1 may have a substantially similar value as a height of the first gate structure 120.

In the second transistor TR2, the pair of second impurity regions 150 may be disposed to vertically overlap only a portion of the second fin active region FA2. The second impurity regions 150 may laterally separated in plan view so as to be disposed on two side portions of the second fin active regions FA2. Accordingly, carriers such as electrons or holes may move, for example, from the second top impurity region 154 to the second bottom impurity region 152 (or in the opposite direction) in a horizontal direction (for example, the Y direction in FIG. 3) in the second transistor TR2. For example, as the pair of second impurity regions 150 may be spaced from each other in the first direction (Y direction) such that a distance that the carriers move may be increased compared with that in the first transistor TR1. In this case, an effective channel length Lg2 in the second transistor TR2 may be determined by a distance between the two second impurity regions 150 in the first direction. As illustrated in FIG. 3, the effective channel length Lg2 in the second transistor TR2 may be longer than the effective channel length Lg1 in the first transistor TR1.

As described above, the effective channel length Lg2 in the second transistor TR2 may be longer than the effective channel length Lg1 in the first transistor TR1. In addition, the second gate insulation layer 144 may include the interface layer 146 and the high-k dielectric layer 148, and the second gate insulation layer 144 may have a greater thickness than the first gate insulation layer 124.

In general, in a downscaled integrated circuit device, a gate-all-around transistor, in which a channel region is formed in a vertical direction, may be used in order to reduce short channel effects. In addition, transistors formed in a low-voltage region may have a relatively short gate electrode and a relatively thin gate insulation layer, whereas transistors formed in a high-voltage region may be formed to have a relatively long gate electrode and a relatively thick gate insulation layer. Regarding transistors formed in the high-voltage region, a relatively long gate electrode and a relatively thick gate insulation layer may be formed in order to prevent reliability degradation due to hot carriers such as a time dependent dielectric breakdown (TDDB) effect and to provide electrostatic stability. In a general manufacturing process, when a gate-all-around transistor is used, the manufacturing process of forming a plurality of transistors including gate electrodes having different lengths in a high-voltage region and a low-voltage region (for example, different thicknesses in a vertical direction) and gate insulation layers having different thicknesses may be complicated. For example, separate processes may be used to respectively form a high-voltage transistor and a low-voltage transistor by performing processes in which different masks are used with respect to the high-voltage region and the low-voltage region, which may increase manufacturing costs and degrade process precision.

In the present example embodiment, the first and second gate structures 120 and 140 may have substantially the same heights (vertical thickness), while the effective channel length Lg2 in the second transistor TR2 may be longer than the effective channel length Lg1 in the first transistor TR1, and a thickness of the second gate insulation layer 144 may be greater than that of the first gate insulation layer 124. Accordingly, the first and second gate structures 120 and 140 may be manufactured using a simplified process, and the integrated circuit device 100 including both a high-voltage transistor and a low-voltage transistor may be obtained by using the simplified manufacturing process.

Figure 4:
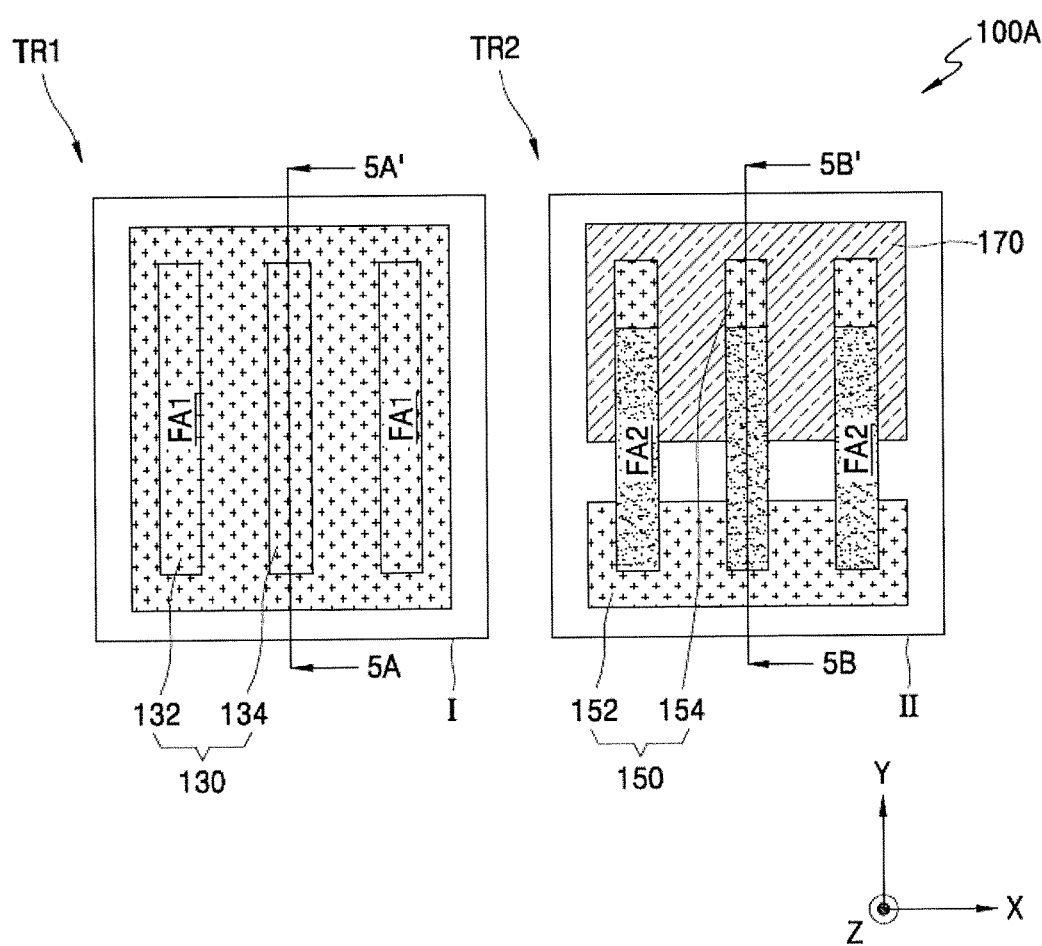
FIG. 4 illustrates a plan view of an integrated circuit device according to example embodiments.
Figure 5:
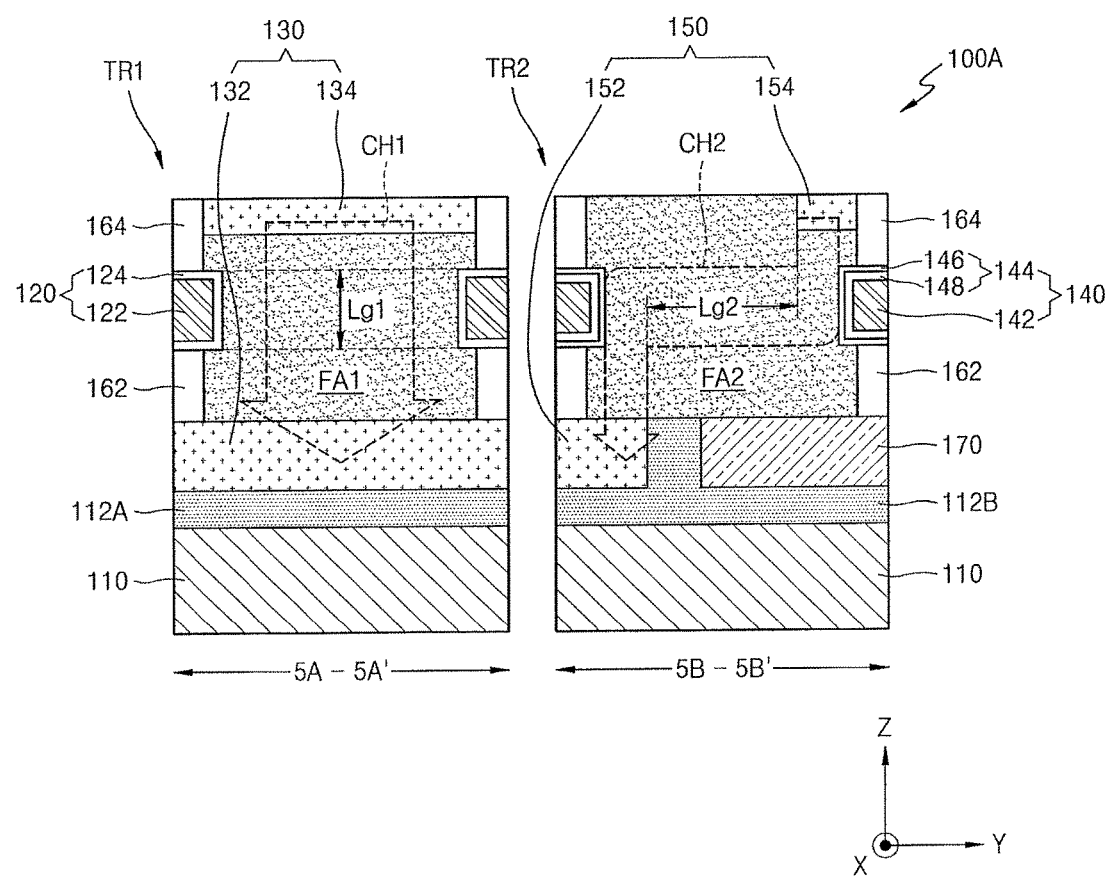
FIG. 5 illustrates a cross-sectional view of the integrated circuit device of FIG. 4 cut along a line 5A-5A' and a line 5B-5B' of FIG. 4.

FIG. 4 is a plan view of an integrated circuit device 100A according to example embodiments, and FIG. 5 is a cross-sectional view of the integrated circuit device 100A of FIG. 4 cut along a line 5A-5A' and a line 5B-5B' of FIG. 4. In FIGS. 4 and 5, like reference numerals as those of FIGS. 1 through 3 denote like elements.

Referring to FIGS. 4 and 5, a third impurity region 170 that is spaced apart from the second bottom impurity region 152 may be further formed on the bottom portion of the second fin active region FA2. The third impurity region 170 may be doped with impurities having a second conductivity type at a high concentration. For example, when the second transistor TR2 is an NMOS transistor, the second bottom impurity region 152 may include an n-type impurity, and the third impurity region 170 may include a p-type impurity.

The third impurity region 170 may be heavily doped with impurities having a different conductivity type from that of the second bottom impurity region 152. Accordingly, when the second bottom impurity region 152 is formed in a side portion of the bottom portion of the second fin active region FA2, the third impurity region 170 may help prevent a parasitic NPN transistor or a parasitic PNP transistor from being formed in a region adjacent to another side portion of the bottom portion of the second fin active region FA2, where the second bottom impurity region 152 is not formed. Also, the third impurity region 170 may help prevent current leakage due to the parasitic transistors. Accordingly, leakage current of the integrated circuit device 100A may be reduced.

An additional third impurity region spaced apart from the second top impurity region 154 may be further disposed in the top portion of the second fin active region FA2. Accordingly, current leakage through the top portion of the second fin active region FA2 (for example, an intrinsic channel region) may be prevented, which may help further reinforce a current conduction path from the second top impurity region 154 to the second bottom impurity region 152 along the effective channel path CH2.

Figure 6:
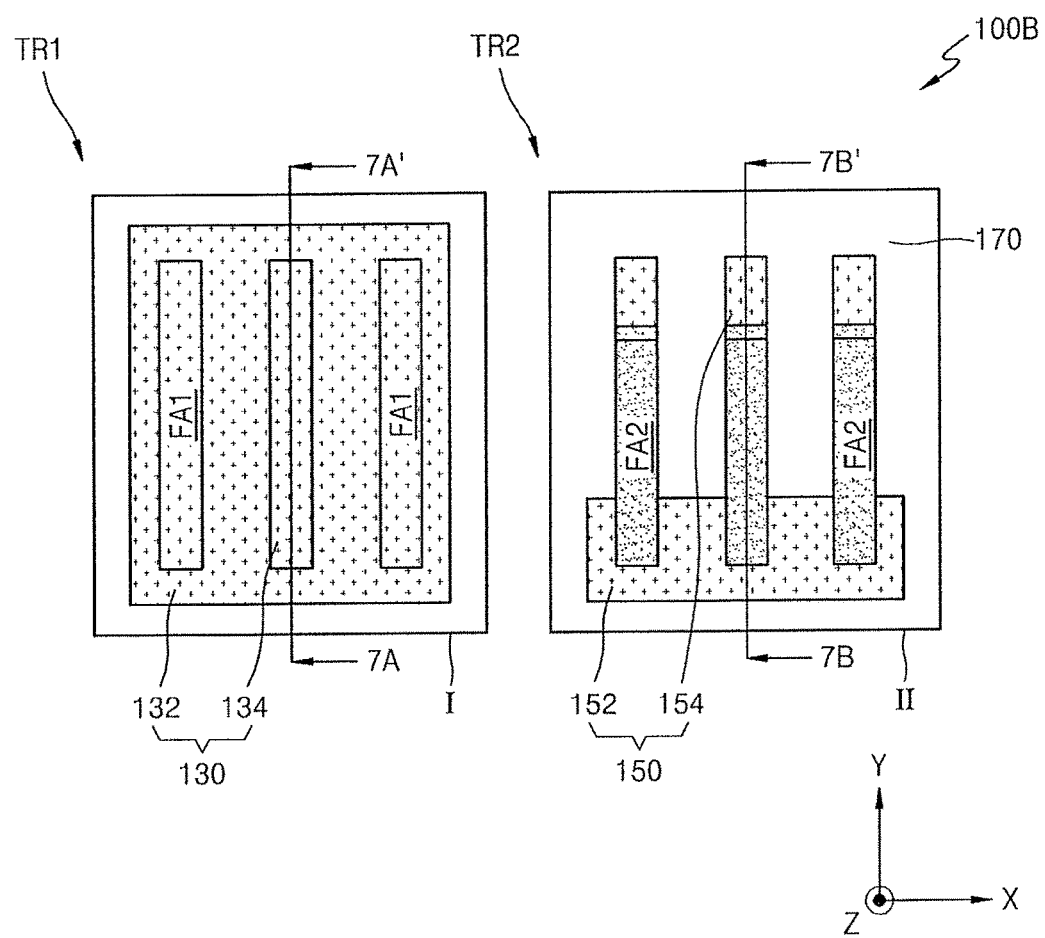
FIG. 6 illustrates a plan view of an integrated circuit device according to example embodiments.
Figure 7:
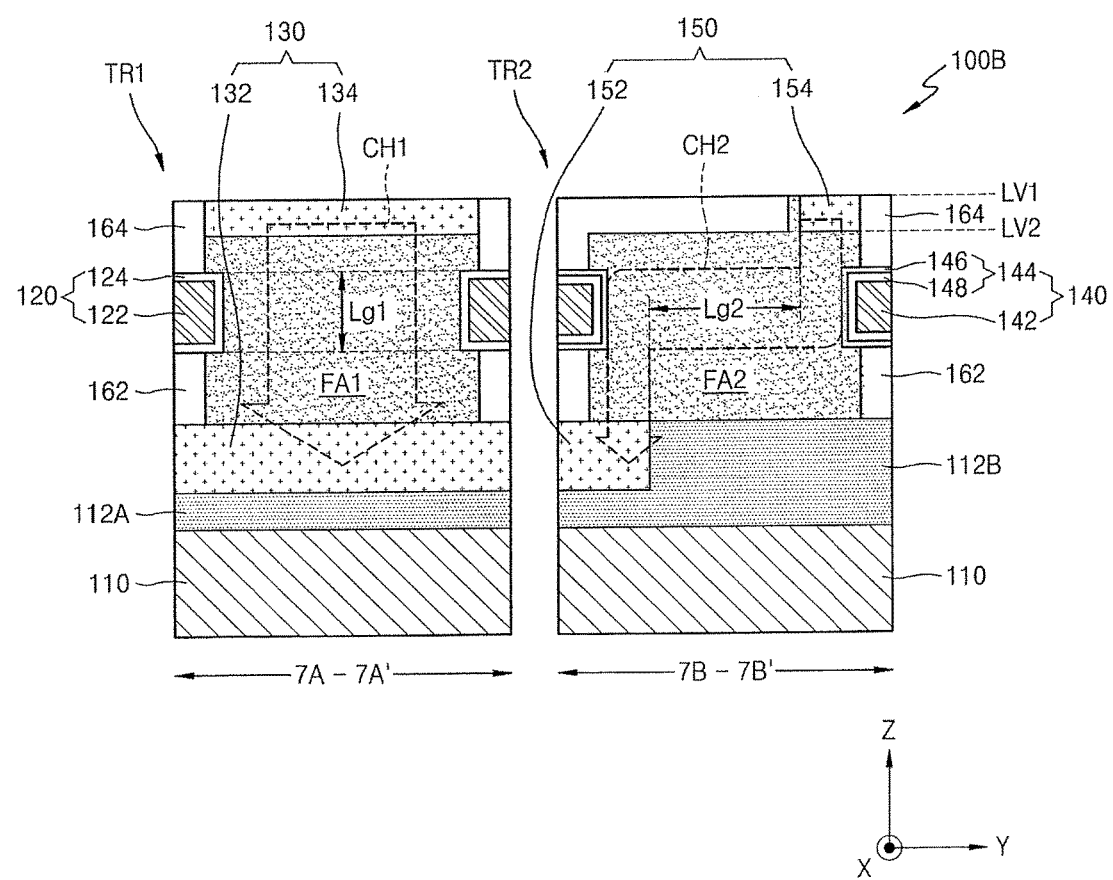
FIG. 7 illustrates a cross-sectional view of the integrated circuit device of FIG. 6 cut along a line 7A-7A' and a line 7B-7B' of FIG. 6.

FIG. 6 is a plan view of an integrated circuit device 100B according to example embodiments, and FIG. 7 is a cross-sectional view of the integrated circuit device 100B of FIG. 6 cut along a line 7A-7A' and a line 7B-7B' of FIG. 6. In FIGS. 6 and 7, like reference numerals as those of FIGS. 1 through 5 denote like elements.

Referring to FIGS. 6 and 7, the top portion of the second fin active region FA2 of the second transistor TR2 may have top surfaces at different levels. For example, a top surface level LV1 of the second top impurity region 154 formed in a side portion of the top portion of the second fin active region FA2 may be higher than a top surface level LV2 of another side portion of the second fin active region FA2. However, the top surface level LV1 of the second top impurity region 154 formed in a side portion of the top portion of the second fin active region FA2 may be substantially equal or similar to a top surface level of the first top impurity region 134 formed in the top portion of the first fin active region FA1.

In an example process of forming the second transistor TR2, a portion of the top portion of the second fin active region FA2, where the second top impurity region 154 is not formed, may be removed, for example, using a dry etching process or an etchback process. As the portion of the second fin active region FA2, where the second top impurity region 154 is not formed, is removed, current leakage through the top portion of the second fin active region FA2 (for example, an intrinsic channel region) may be prevented, thereby further reinforcing a current conduction path to the second bottom impurity region 152 along the effective channel path CH2.

Figure 8:
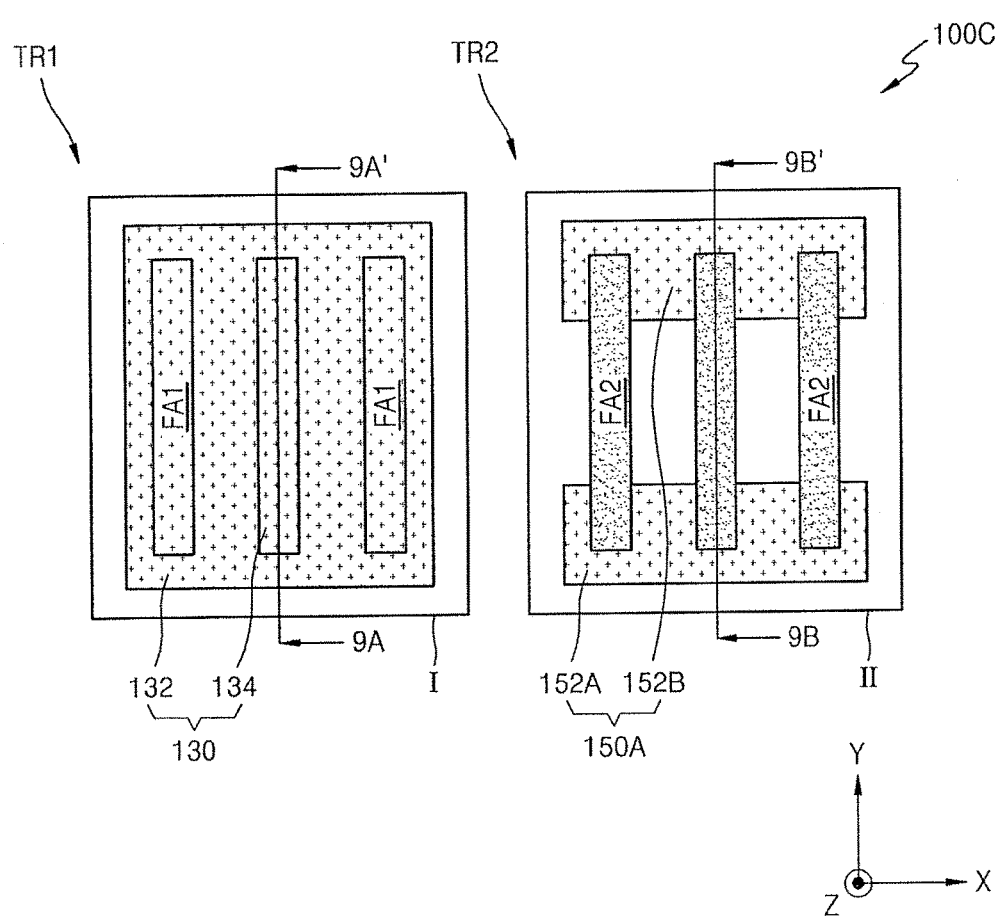
FIG. 8 illustrates a plan view of an integrated circuit device according to example embodiments.
Figure 9:
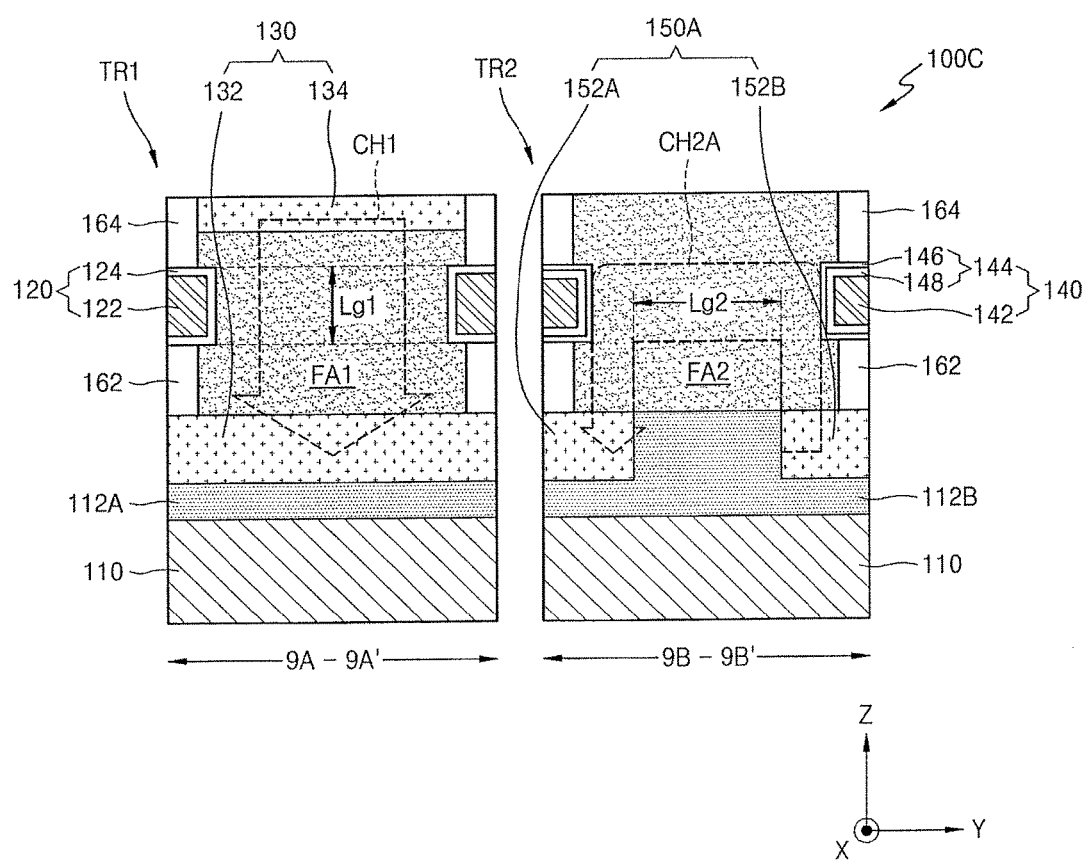
FIG. 9 illustrates a cross-sectional view of the integrated circuit device of FIG. 8 cut along a line 9A-9A' and a line 9B-9B' of FIG. 8.

FIG. 8 is a plan view of an integrated circuit device 100C according to example embodiments, and FIG. 9 is a cross-sectional view of the integrated circuit device 100C of FIG. 8 cut along a line 9A-9A' and a line 9B-9B' of FIG. 8. In FIGS. 8 and 9, like reference numerals as those of FIGS. 1 through 7 denote like elements.

Referring to FIGS. 8 and 9, a pair of second impurity regions 150A may include second and third bottom impurity regions 152A and 152B. The second and third bottom impurity regions 152A and 152B may be spaced apart from each other in the bottom portion of the second fin active region FA2 in the first direction (Y direction).

The second gate structure 140 is disposed to surround the sidewalls of the second fin active region FA2, and as the pair of second impurity regions 150A are spaced apart from each other in the bottom portion of the second fin active region FA2, an example channel path CH2A that may be formed in the second transistor TR2 may be different from the channel path CH2 of the integrated circuit device 100 described with reference to FIGS. 1 through 3.

For example, carriers such as electrons or holes may move vertically from the third bottom impurity region 152B to a portion of the second fin active region FA2 at the same level as the second gate structure 140, and then move horizontally at the same level as the second structure 140, and then again vertically to the second bottom impurity region 152A. For example, the example channel path CH2A may have an even longer effective channel length Lg2 than the effective channel length Lg1 of the example channel path CH1 that may be formed in the first transistor TR1.

According to the integrated circuit device 100C, even when the first and second gate structures 120 and 140 have substantially the same height (vertical thickness), the effective channel length Lg2 in the second transistor TR2 may be longer than the effective channel length Lg1 in the first transistor TR1. Accordingly, the first and second gate structures 120 and 140 may be manufactured using a simplified method. By using the simplified method, the integrated circuit device 100C having both a high-voltage transistor and a low-voltage transistor may be obtained.

Figure 10:
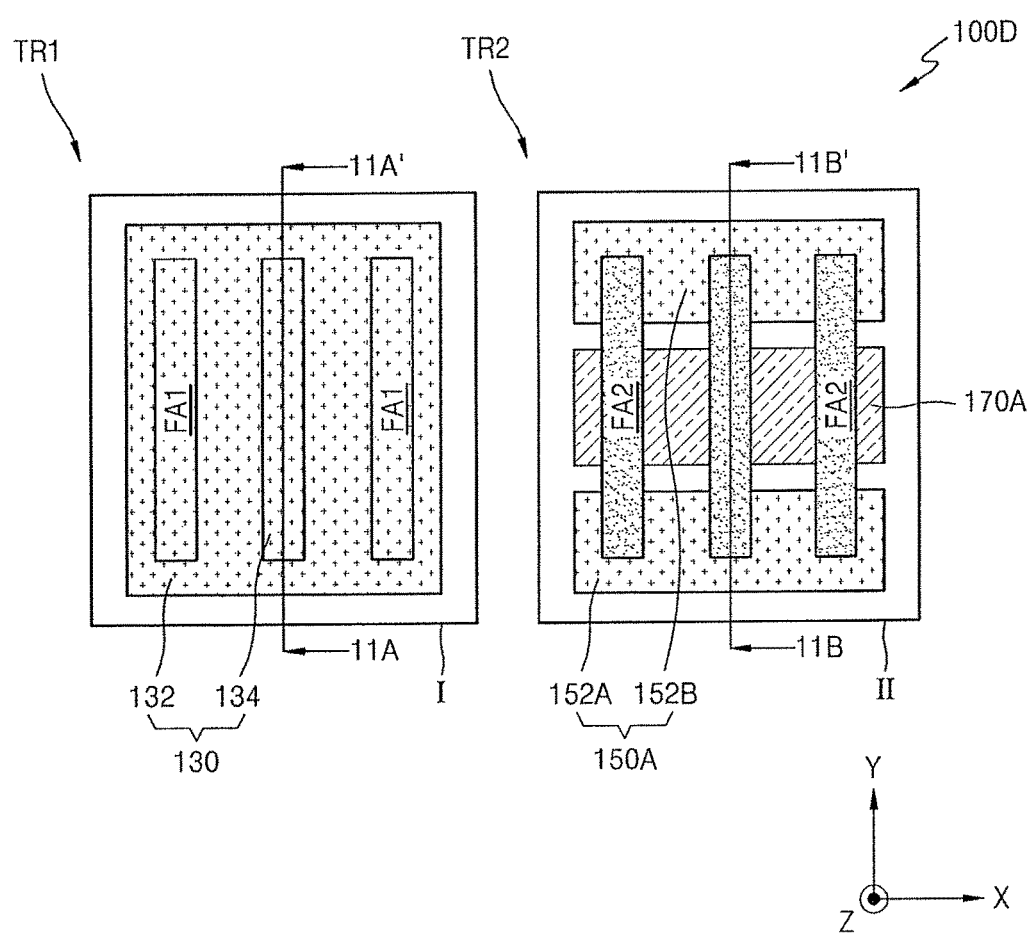
FIG. 10 illustrates a plan view of an integrated circuit device according to example embodiments.
Figure 11:
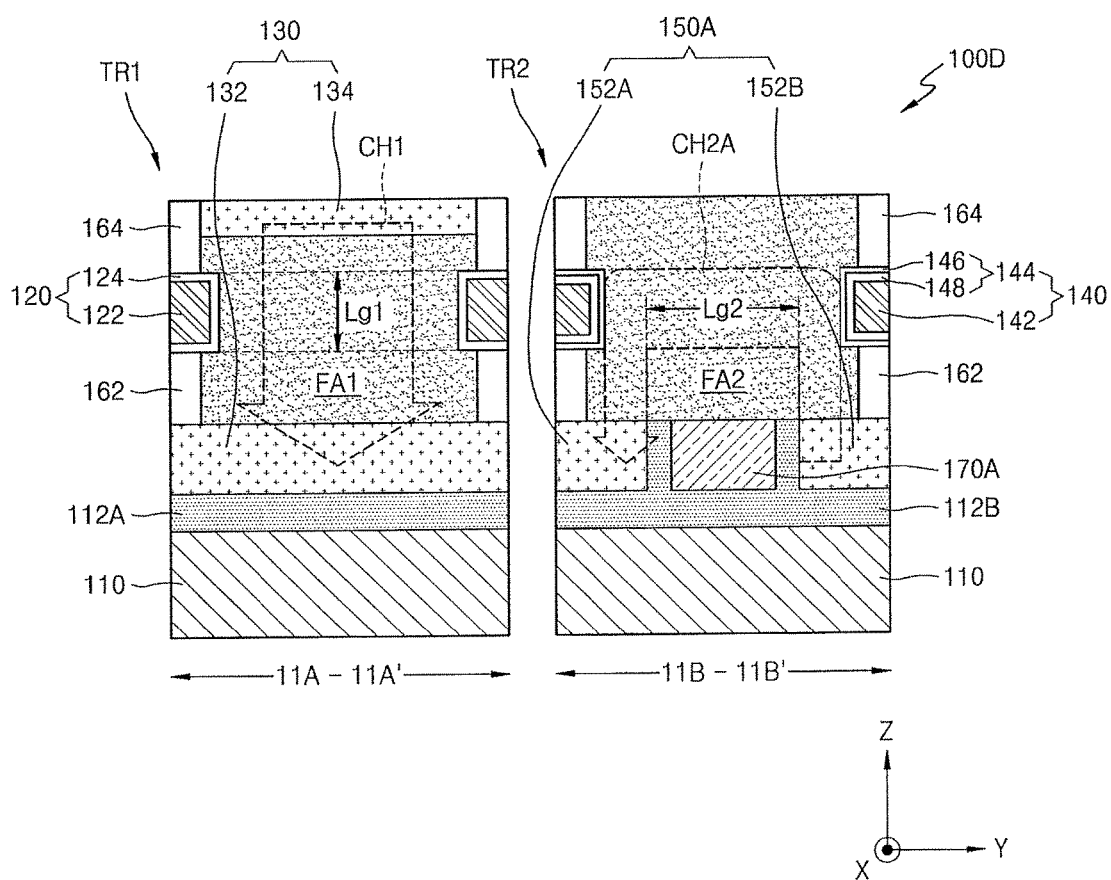
FIG. 11 illustrates a cross-sectional view of the integrated circuit device of FIG. 10 cut along a line 11A-11A' and a line 11B-11B' of FIG. 10.

FIG. 10 is a plan view of an integrated circuit device 100D according to example embodiments, and FIG. 11 is a cross-sectional view of the integrated circuit device 100D of FIG. 10 cut along a line 11A-11A' and a line 11B-11B' of FIG. 10. In FIGS. 10 and 11, like reference numerals as those of FIGS. 1 through 9 denote like elements.

Referring to FIGS. 10 and 11, a pair of second impurity regions 150A may include second and third bottom impurity regions 152A and 152B. A third impurity region 170A may be spaced apart from the second and third bottom impurity regions 152A and 152E in a bottom portion of the second fin active region FA2. The third impurity region 170A may be a highly doped region with an impurity having a different conductivity type from that of the second and third bottom impurity regions 152A and 152B. Accordingly, current leakage through an inner portion (for example, an intrinsic channel region) or a bottom portion of the second fin active region FA2 at a lower level than a bottom surface of the second gate structure 140 may be prevented, thereby reinforcing a current conduction path from the third bottom impurity region 152B to the second bottom impurity region 152A along the effective channel path CH2A.

An additional third impurity region may be further formed in a top portion of the second fin active region FA2. For example, the additional third impurity region may be formed to vertically overlap the entire area of the second fin active region FA2. Accordingly, current leakage through the top portion of the second fin active region FA2 (for example, an intrinsic channel region) may be prevented, thereby further reinforcing a current conduction path along the effective channel path CH2A.

Figure 12:
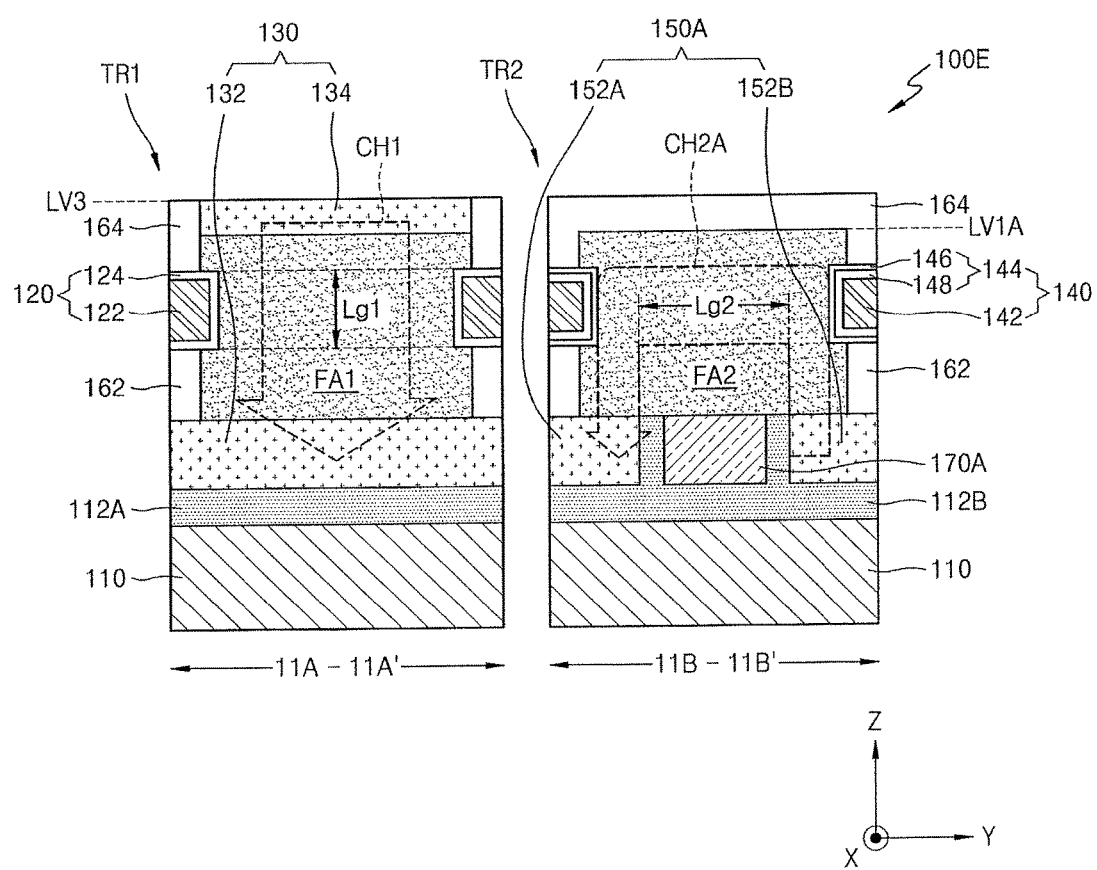
FIG. 12 illustrates a cross-sectional view illustrating an integrated circuit device according to example embodiments.

FIG. 12 is a cross-sectional view illustrating an integrated circuit device 100E according to example embodiments. In detail, FIG. 12 is a cross-sectional view of the integrated circuit device 100E cut along a line 11A-11A' and a line 11B-11B' of FIG. 10. In FIG. 12, like reference numerals as those of FIGS. 1 through 11 denote like elements.

Referring to FIG. 12, a top surface level LV1A of the second fin active region FA2 may be lower than a top surface level LV3 of the first fin active region FA1.

In an example process of forming a second transistor TR2, a portion of the second fin active region FA2 corresponding to a predetermined thickness may be removed from a top surface thereof, for example, using a dry etching process or an etchback process. For example, the top surface level LV1A of the second fin active region FA2 may be lower than a top surface level LV3 of the first fin active region FA1 and higher than a top surface level of the second gate structure 140. As the portion of the top portion of the second fin active region FA2 corresponding to a predetermined thickness is removed, current leakage through the top portion of the second fin active region FA2 (for example, an intrinsic channel region) may be prevented, thereby further reinforcing a current conduction path along the effective channel path CH2A.

Figure 13:
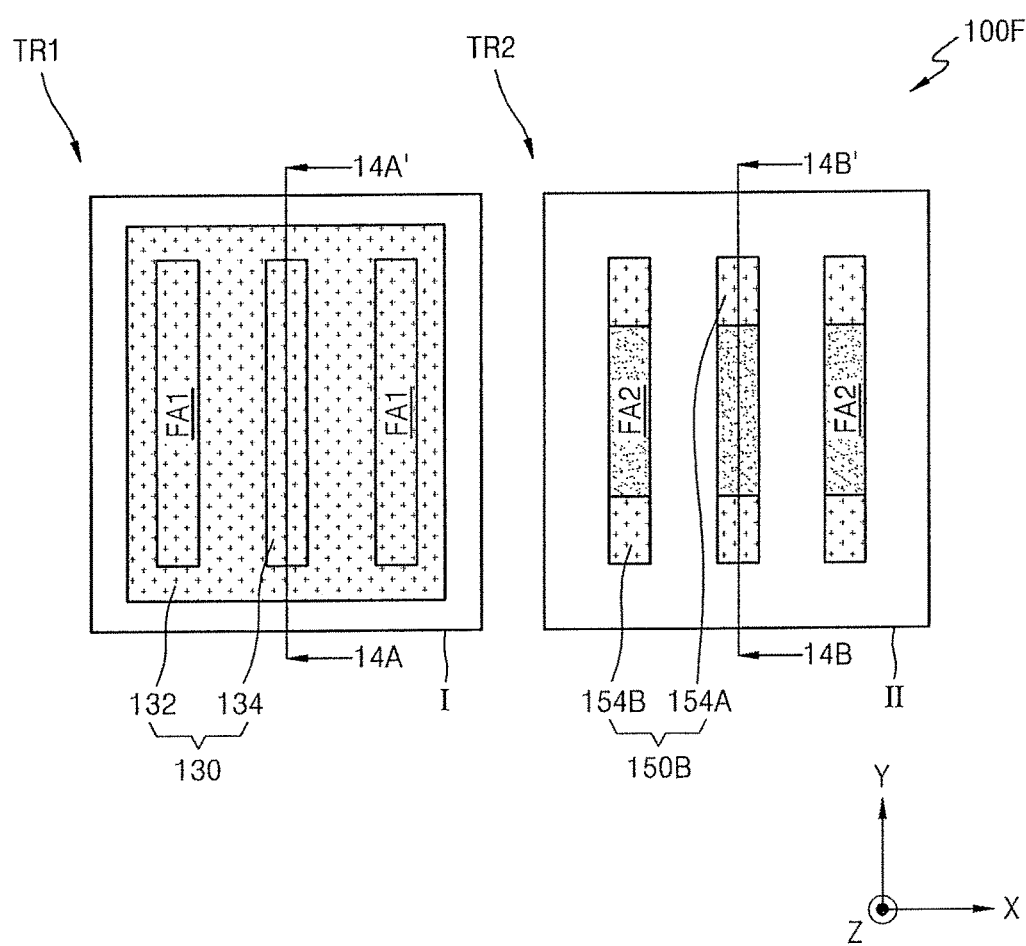
FIG. 13 illustrates a plan view of an integrated circuit device according to example embodiments.
Figure 14:
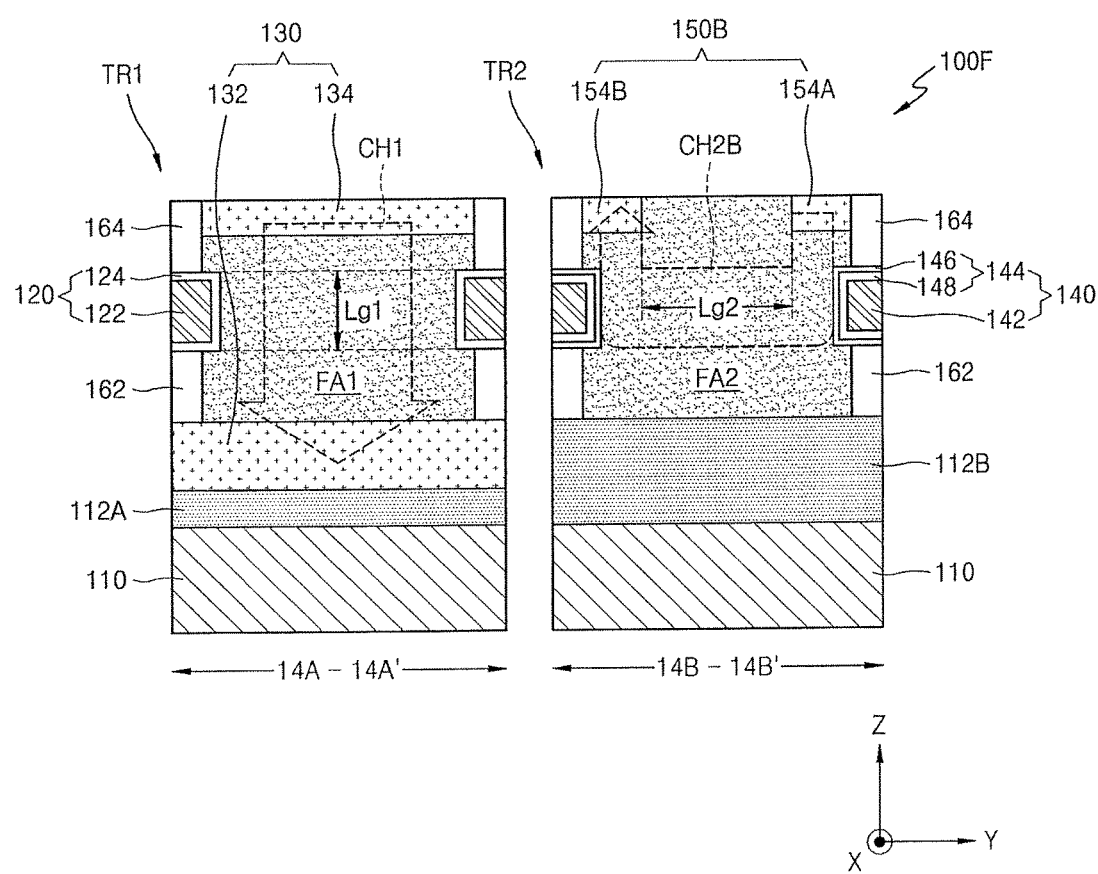
FIG. 14 illustrates a cross-sectional view of the integrated circuit device of FIG. 13 cut along a line 14A-14A' and a line 14B-14B' of FIG. 13.

FIG. 13 is a plan view of an integrated circuit device 100F according to example embodiments, and FIG. 14 is a cross-sectional view of the integrated circuit device 100F of FIG. 13 cut along a line 14A-14A' and a line 14B-14B' of FIG. 13. In FIGS. 13 and 14, like reference numerals as those of FIGS. 1 through 12 denote like elements.

Referring to FIGS. 13 and 14, a pair of second impurity regions 150B may include second and third top impurity regions 154A and 154B. The second and third top impurity regions 154A and 154B may be spaced apart from each other in a top portion of the second fin active region FA2 in the first direction (Y direction).

The second gate structure 140 is disposed to surround sidewalls of the second fin active region FA2, and as the pair of second impurity regions 150B are spaced apart from each other in the top portion of the second fin active region FA2, an example channel path CH2B that may be formed in the second transistor TR2 may be different from the channel path CH2 of the integrated circuit device 100 described with reference to FIGS. 1 through 3.

For example, carriers such as electrons or holes may move vertically from the second top impurity region 154A to a portion of the second fin active region FA2 at the same level as the second gate structure 140, and then move horizontally at the same level as the second structure 140, and then again vertically to the third top impurity region 154B. For example, the example channel path CH2B may have an even longer effective channel length Lg2 than the effective channel length Lg1 of the example channel path CH1 that may be formed in the first transistor TR1.

According to the integrated circuit device 100F, even when the first and second gate structures 120 and 140 have substantially the same height (vertical thickness), the effective channel length Lg2 in the second transistor TR2 may be longer than the effective channel length Lg1 in the first transistor TR1. Accordingly, the first and second gate structures 120 and 140 may be manufactured using a simplified method. By using the simplified method, the integrated circuit device 100F having both a high-voltage transistor and a low-voltage transistor may be obtained.

Figure 15:
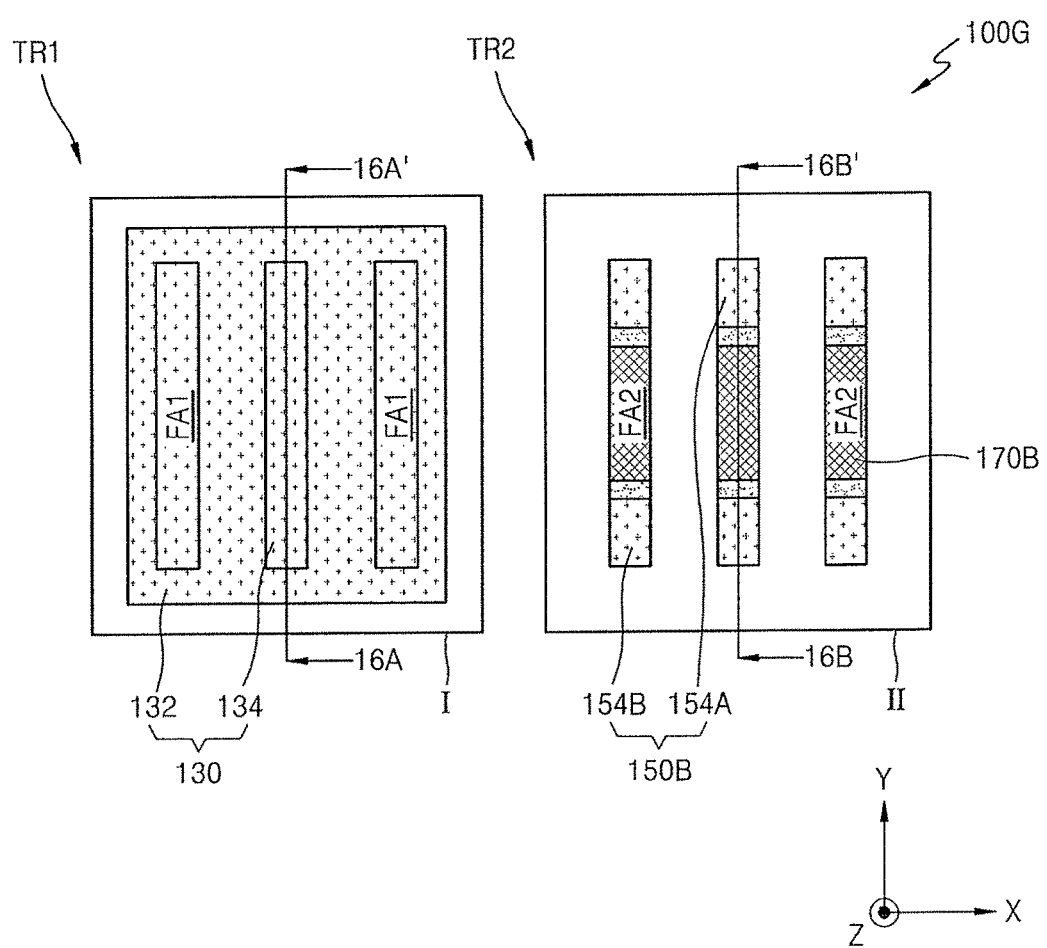
FIG. 15 illustrates a plan view of an integrated circuit device according to example embodiments.
Figure 16:
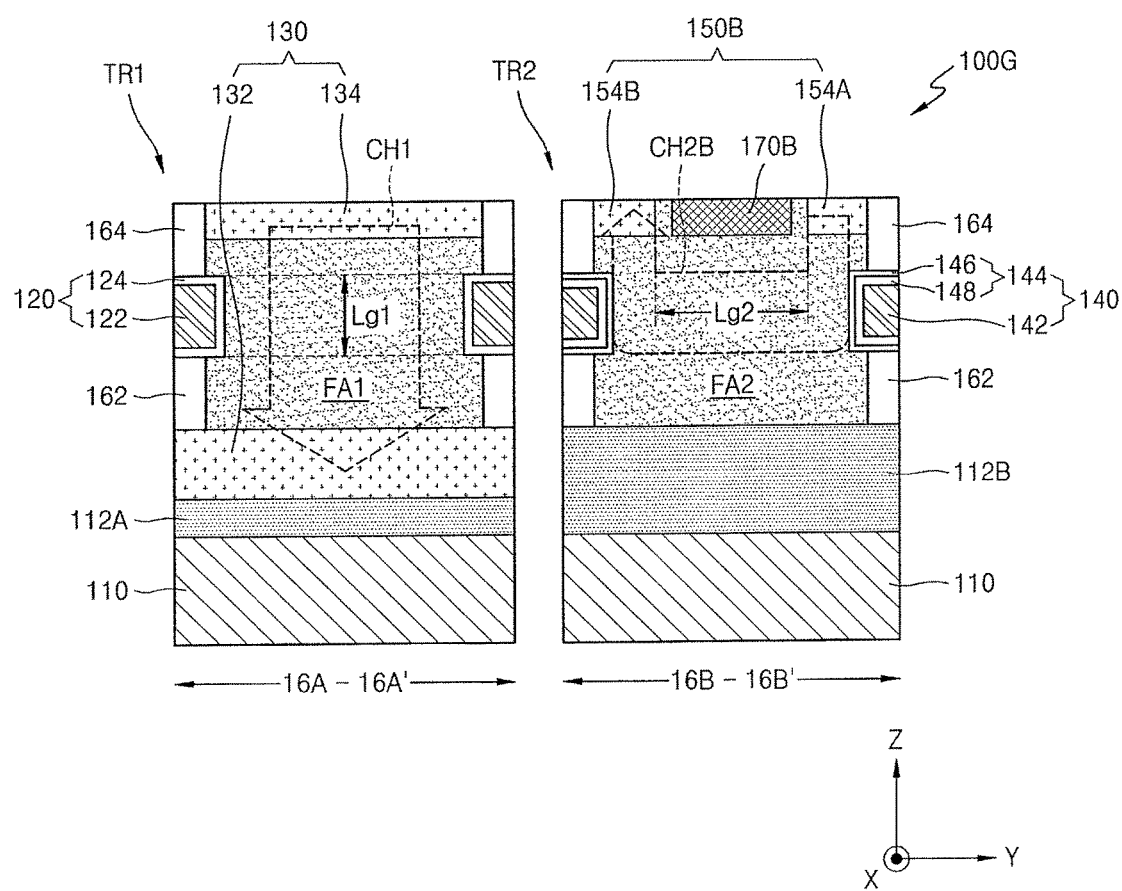
FIG. 16 illustrates a cross-sectional view of the integrated circuit device of FIG. 15 cut along a line 16A-16A' and a line 16B-16B' of FIG. 15.

FIG. 15 is a plan view of an integrated circuit device 100G according to example embodiments, and FIG. 16 is a cross-sectional view of the integrated circuit device 100G of FIG. 15 cut along a line 16A-16A' and a line 16B-16B' of FIG. 15. In FIGS. 15 and 16, like reference numerals as those of FIGS. 1 through 14 denote like elements.

Referring to FIGS. 15 and 16, a pair of second impurity regions 150B may include second and third top impurity regions 154A and 154B. A third impurity region 170B may be spaced apart from the second and third bottom impurity regions 154A and 154B in a top portion of the second fin active region FA2. The third impurity region 170B may be a highly doped region with an impurity having a different conductivity type from that of the second and third top impurity regions 154A and 154B. Accordingly, current leakage through an inner portion (for example, an intrinsic channel region) of the second fin active region FA2 at a higher level than a bottom surface of the second gate structure 140 may be prevented, thereby further reinforcing a current conduction path from the second top impurity region 154A to the third top impurity region 154B along the effective channel path CH2B.

Figure 17:
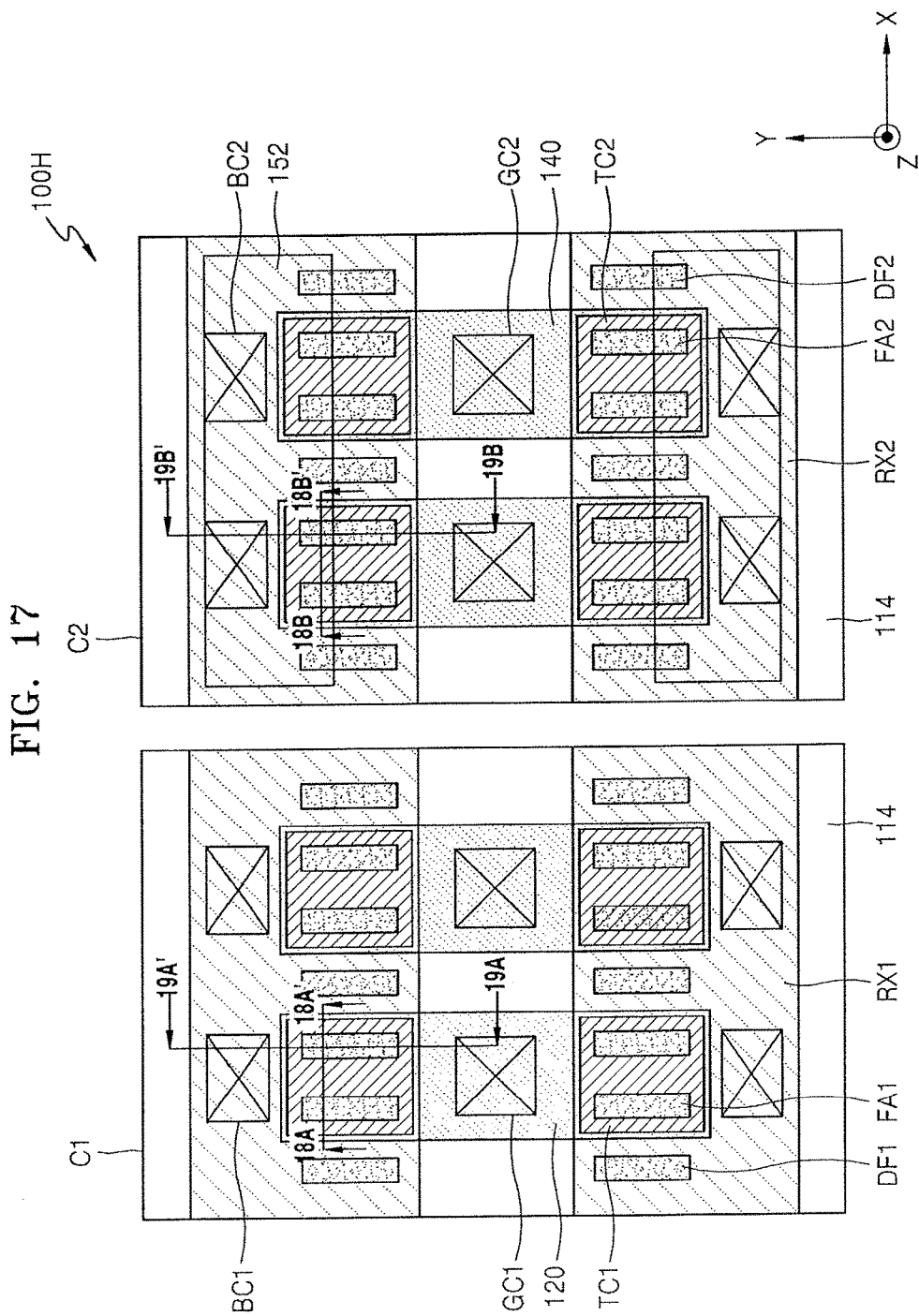
FIG. 17 illustrates a plan view of an integrated circuit device according to example embodiments.
Figure 18:
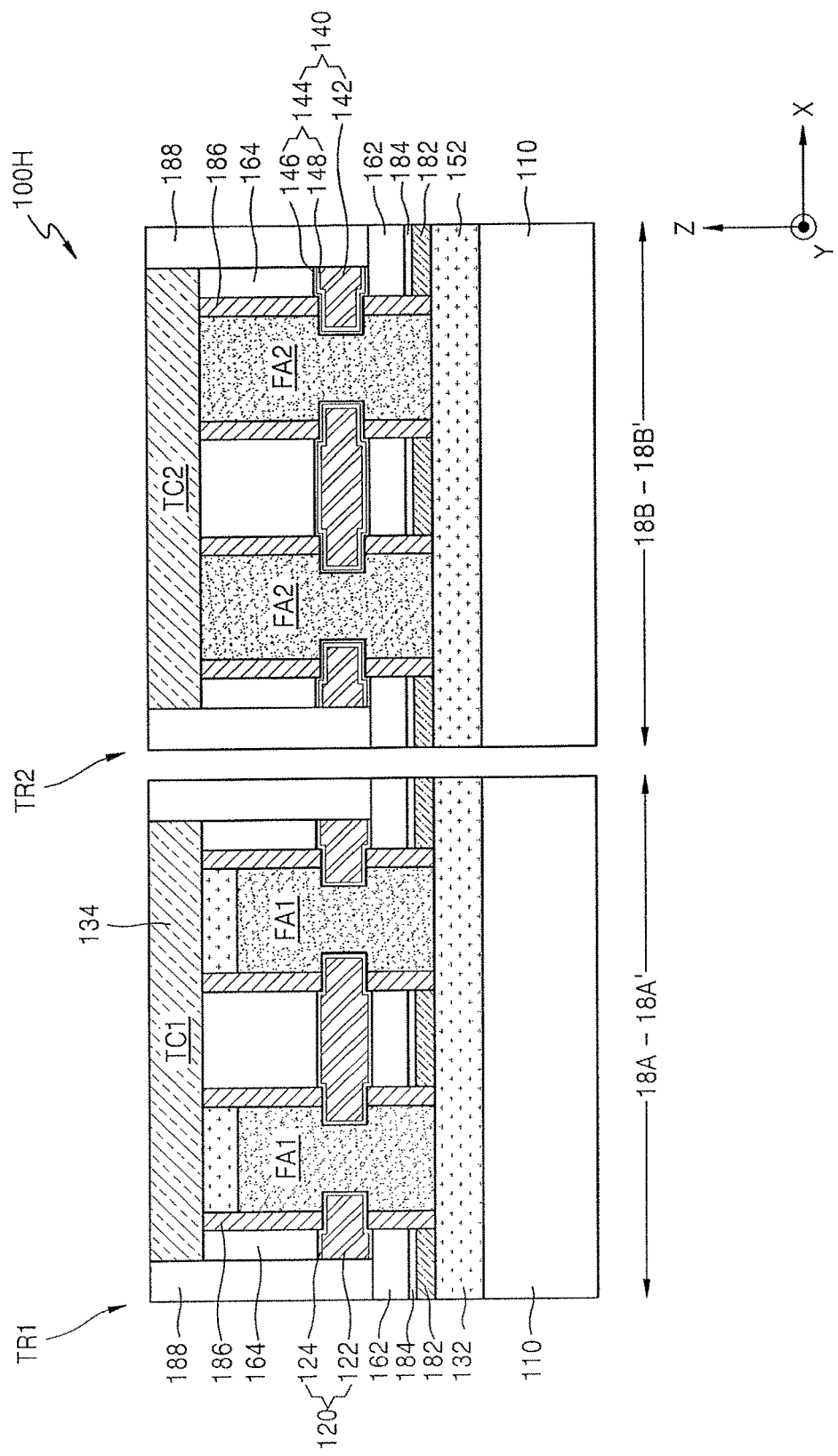
FIG. 18 illustrates a cross-sectional view of the integrated circuit device of FIG. 17 cut along a line 18A-18A' and a line 18B-18B' of FIG. 17.
Figure 19:
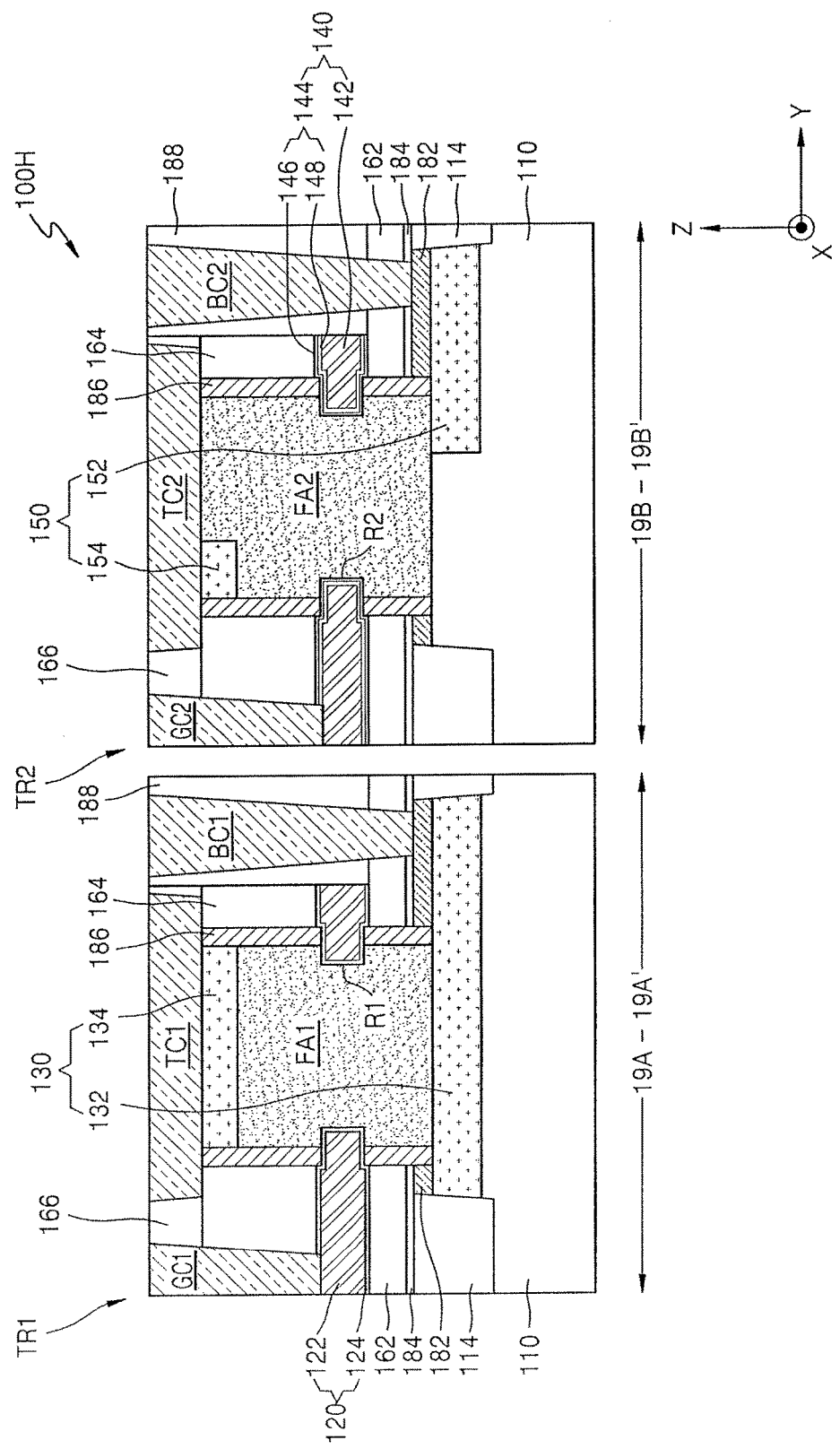
FIG. 19 illustrates a cross-sectional view of the integrated circuit device of FIG. 17 cut along a line 19A-19A' and a line 19B-19B' of FIG. 17.

FIG. 17 is a plan view of an integrated circuit device 100H according to example embodiments, and FIG. 18 is a cross-sectional view of the integrated circuit device 100H of FIG. 17 cut along a line 18A-18A' and a line 18B-18W of FIG. 17, and FIG. 19 is a cross-sectional view of the integrated circuit device 100H of FIG. 17 cut along a line 19A-19A' and a line 19B-19B' of FIG. 17. The integrated circuit device 100H illustrated in FIGS. 17 through 19 may be an integrated circuit device using standard cells used in a standard cell library.

The integrated circuit device 100H may be defined by a plurality of cells, and for example, may be designed using a cell library including characteristic information about the plurality of cells. The cell library may define, for example, cell names, dimensions, gate widths, pins, delay characteristics, leakage current, threshold voltages, and functions of the cells. A typical cell library set may include basic cells such as AND, OR, NOR, and inverters, complex cells such as OAI (OR/AND/INVERTER) and AOI (AND/OR/INVERTER), and a storage element such as a simple master-slave flip-flop and a latch.

In a standard cell method, a large-scale integrated circuit (LSI) may be designed by preparing logic circuit blocks (or cells) having multiple functions in advance and then forming dedicated LSI fitting specifications of a customer or a user by combining the cells. The cells may be pre-designed and verified to be registered to a computer, and logic design, placement, and routing may be performed by combining the cells by using computer aided design (CAD).

When designing or manufacturing an LSI, standardized logic circuit blocks (or cells) of a predetermined scale may already be in a library, a logic circuit block that fits the current design objective may be taken and placed in a plurality of cell rows on a chip, and optimum placement allowing shortest wiring lengths in wiring space between the cells may be performed to form an entire circuit. The richer the types of cells preserved in the library, the flexibility of the design increases, and accordingly, a more optimum chip design is also possible.

The integrated circuit using standard cells as described above may be a type of semicustom integrated circuit, and is implemented using standard cells pre-designed and stored in a standard cell library and by placing the cells with minimum routing. Accordingly, compared with full-custom integrated circuits, development costs may be reduced and the development period may be shortened.

Referring to FIGS. 17 through 19, the integrated circuit device 100H may include a first cell C1 and a second cell C2 defined by a cell boundary. In the first cell C1 and the second cell C2, a plurality of first regions RX1 and a plurality of second regions RX2 may be defined via an isolation layer 114. In the plurality of first regions RX1, a plurality of first fin active regions FA1 and a plurality of dummy regions DF1 may be disposed, and in the plurality of second regions RX2, a plurality of second fin active regions FA2 and a plurality of second dummy regions DF2 may be disposed.

A first bottom impurity region 132 may be formed substantially over the entire area of the plurality of first regions RX1, and the second bottom impurity region 152 may be formed on partial area of the plurality of second regions RX2. The first and second bottom impurity regions 132 and 152 may have similar characteristics to those described with reference to FIGS. 1 through 3.

An intermediate layer 182 may be formed on the plurality of first regions RX1 and the plurality of second regions RX2, and the intermediate layer 182 may include, for example, a metal silicide material such as a tungsten silicide, a cobalt silicide, or a nickel silicide. For example, the intermediate layer 182 may be formed on portions of the plurality of first regions RX1 and the plurality of second regions RX2, where a plurality of first fin active regions FA1, a plurality of first dummy regions DF1, a plurality of second fin active regions FA2, and a plurality of second dummy regions DF2 are not formed.

An etch stopper layer 184 may be formed on the intermediate layer 182, and an insulation liner 186 may be formed on sidewalls of the plurality of first and second fin active regions FA1 and FA2. In an example embodiment, the etch stopper layer 184 may include silicon nitride. The insulation liner 186 may include, for example, an impurity-doped oxide, a low-k dielectric oxide, or a combination thereof. For example, the insulation liner 186 may have a double-layer structure including an impurity-doped oxide and a low-k dielectric oxide such as SiOCN.

A first insulation layer 162 surrounding the sidewalls of the first and second fin active regions FA1 and FA2 may be formed on the etch stopper layer 184. The first insulation layer 162 may extend to sidewalls of the plurality of first and second dummy regions DF1 and DF2.

First and second gate structures 120 and 140 respectively surrounding the sidewalls of the first and second fin active regions FA1 and FA2 may be formed on the first insulation layer 162. The first and second gate structures 120 and 140 may pass through the insulation liner 186 to directly contact the plurality of first and second fin active regions FA1 and FA2. For example, a recess R1 (see FIG. 23) may be formed in a portion of the sidewall of the plurality of fin active regions FA1, and the first gate structure 120 may contact the recess R1. The first and second gate structures 120 and 140 may have similar characteristics as those described with reference to FIGS. 1 through 3.

A second insulation layer 164 surrounding the sidewalls of the plurality of first and second fin active regions FA1 and FA2 may be formed on the first and second gate structures 120 and 140. A third insulation layer 166 may be formed on the second insulation layer 164. An intergate insulation layer 188 filling space between the first gate structure 120 and another adjacent first gate structure 120 may be formed on the first insulation layer 162. The intergate insulation layer 188 may be disposed to face the sidewalls of the second and third insulation layers 164 and 166 and may surround the sidewalls of the plurality of first dummy regions DF1. The first through third insulation layers 162, 164, and 166 and the intergate insulation layer 188 may be formed of a TEOS layer, a ULK layer having an ultra-low dielectric constant of about 2.2 to 2.4, for example, one of a SiOC layer and a SiCOH layer.

Gate contacts GC1 and GC2 may pass through the second and third insulation layers 164 and 166 to be electrically connected to the first and second gate electrodes 122 and 142. Top contacts TC1 and TC2 may pass through the third insulation layer 166 to be electrically connected to the first and second top impurity regions 134 and 154. Bottom contacts BC1 and BC2 may pass through the intergate insulation layer 188 and the first insulation layer 162 to be electrically connected to the first and second bottom impurity regions 132 and 152. The gate contacts GC1 and GC2, the top contacts TC1 and TC2, and the bottom contacts BC1 and BC2 may include a metal such as titanium, a titanium nitride, tantalum, a tantalum nitride, or tungsten.

Although not illustrated in the drawings, a wiring structure that is electrically connected to the gate contacts GC1 and GC2, the top contacts TC1 and TC2, and the bottom contacts BC1 and BC2 may be further disposed. Through the wiring structure, a relatively low operating voltage VDD may be applied to the first cell C1 and a relatively high operating voltage VDD may be applied to the second cell C2.

FIGS. 20 through 26 are cross-sectional views illustrating a method of manufacturing an integrated circuit device according to example embodiments. The manufacturing method may be the manufacturing method of the integrated circuit device 100H described with reference to FIGS. 17 through 19, and in FIGS. 20 through 26, cross-sectional views corresponding to cross-sections cut along lines 19A-19A' and 19B-19B' of FIG. 17 are illustrated according to a process order.

Figure 20:
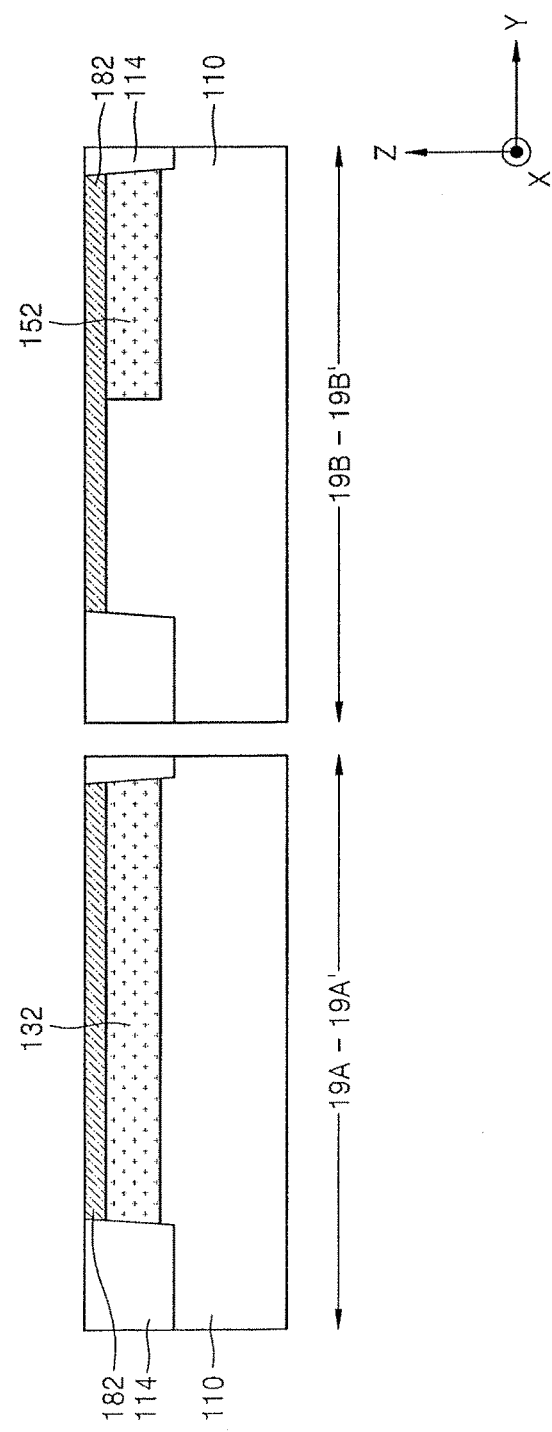
FIGS. 20 through 26 illustrate cross-sectional views illustrating a method of manufacturing an integrated circuit device according to example embodiments.

Referring to FIG. 20, a first region RX1 and a second region RX2 may be defined by forming the isolation layer 114 on the substrate 110.

For example, in order to form the isolation layer 114, a mask pattern may be formed on the substrate 110. The mask pattern may be used as an etching mask to form a trench in the substrate 110. In an example embodiment, the mask pattern may be a thermal oxide layer, a silicon nitride layer, a silicon oxynitride layer, a spin on glass (SOG) layer, a spin on hardmask (SOH) layer, a photoresist layer, or a combination thereof, etc.

Subsequently, an insulation layer filling the trench may be formed, for example, in a coating process or a deposition process, and a top surface of the insulation layer may be planarized until the top surface of the substrate 110 is exposed, thereby forming the isolation layer 114 that fills the trench. The isolation layer 114 may be formed of, for example, FSG, USG, BPSG, PSG, FOX, PE-TEOS, or TOSZ using, for example, a flowable CVD (FCVD) process or a spin coating process.

A first impurity may be ion-implanted into the first region RX1 and the second region RX2 of the substrate 110 to form a first bottom impurity region 132 and a second bottom impurity region 152 that extend to a predetermined depth from the substrate 110. For example, when an NMOS transistor is formed on the substrate 110, the first impurity may be an n-type conductivity type. When a PMOS transistor is formed on the substrate 110, the first impurity may be a p-type conductivity type.

In an example embodiment, by using an ion-implantation mask including openings that expose substantially the entire surface of the first region RX1 and a portion of the second region RX2, the first bottom impurity region 132 and the second bottom impurity region 152 may be formed simultaneously.

While a process of implanting an impurity of the same conductivity into the first region RX1 and the second region RX2 is described above with reference to FIG. 17, an ion implantation process for forming the first bottom impurity region 132 in the first region RX1 may be performed first, and then an ion implantation process for forming the second bottom impurity region 152 in the second region RX2 may be performed. In another example, when an NMOS device is formed in the first region RX1 and the second region RX2, and the substrate 110 further includes a third region where a PMOS device is to be formed, after an ion implantation process for forming the first and second bottom impurity regions 132 and 152 in the first region RX1 and the second region RX2 at the same time, an additional ion implantation process for forming a bottom impurity region in the third region RX3 may be further performed.

In an implementation, in the first region RX1 and the second region RX2, the first well region 112A (see FIG. 1) and the second well region 112B (see FIG. 1) may be further formed.

Next, an intermediate layer 182 may be formed on the first region RX1 and the second region RX2 of the substrate 110. For example, after forming a metal layer on a top surface of the substrate 110, the substrate 110, on which the metal layer is formed, may be thermally treated so as to form the intermediate layer 182. The metal layer may be selectively removed. For example, the intermediate layer 182 may include a metal silicide such as tungsten silicide, cobalt silicide, or nickel silicide.

Figure 21:
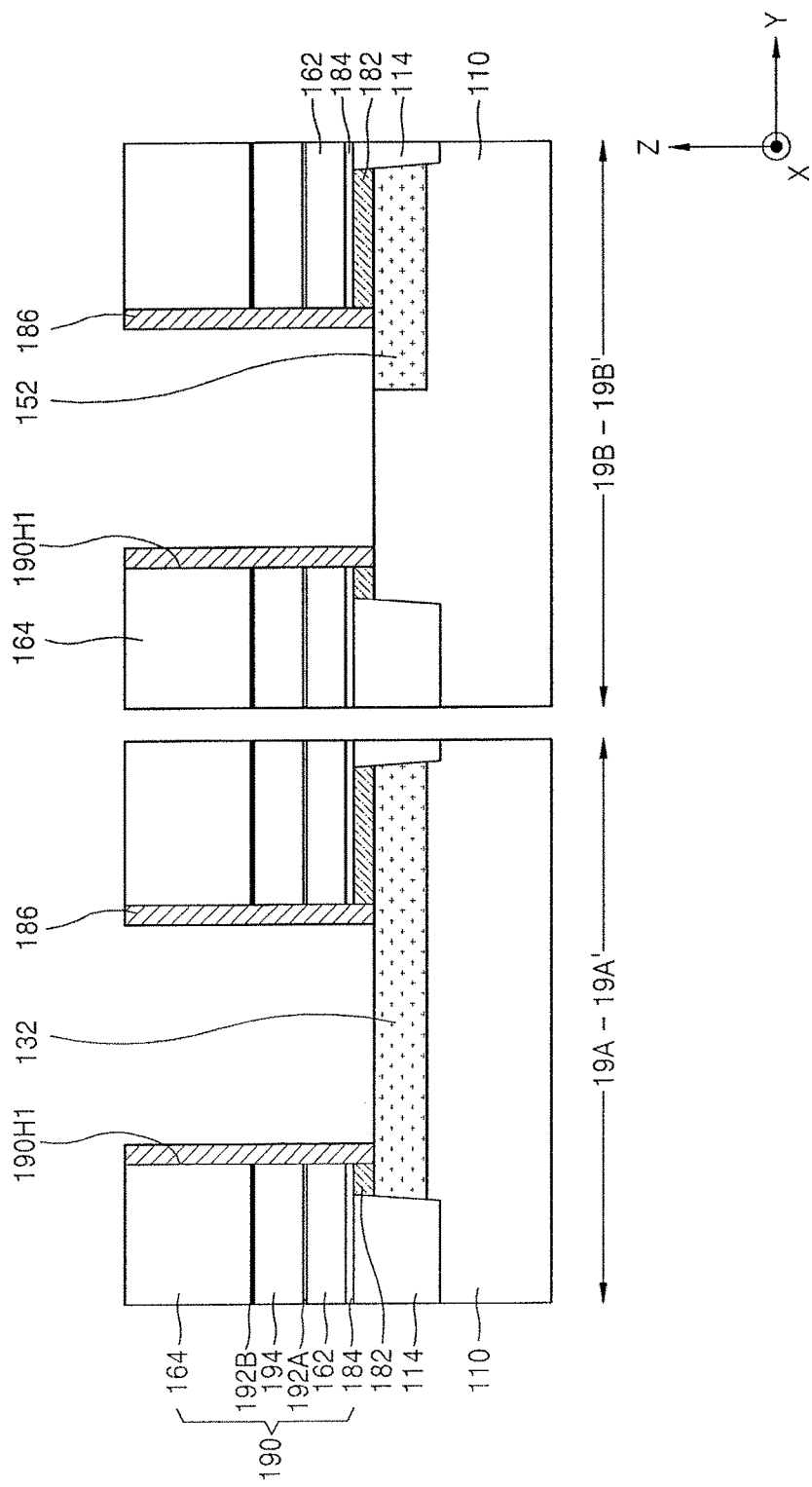

Referring to FIG. 21, a mold structure 190 may be formed on the substrate 110. The mold structure 190 may include, for example, an etch stopper layer 184, a first insulation layer 162, a conductive liner 192A, a sacrificial layer 194, a conductive liner 192B, and a second insulation layer 164 that are sequentially stacked on the substrate 110. For example, the etch stopper layer 184 may include silicon nitride, the first and second insulation layers 162 and 164 may include silicon oxide, silicon oxynitride, a dielectric layer having a low dielectric constant, or a combination thereof, and the sacrificial layer 194 may include silicon nitride. The conductive liners 192A and 192B may include polysilicon. The sacrificial layer 194 may be formed of a material having an etching selectivity with respect to the first and second insulation layers 162 and 164.

Next, a mask pattern may be formed on the mold structure 190, and the mask pattern may be used as an etching mask to sequentially etch the mold structure 190, thereby forming a first opening portion 190H1. The first opening portion 190H1 may expose a top surface of the substrate 110, and a portion of the substrate 110 may be over-etched by a predetermined depth so that a portion of the intermediate layer 182 exposed through the first opening portion 190H1 is removed.

Next, an insulation layer may be formed on a top surface and a sidewall of the first opening portion 190H1 and the exposed top surface of the substrate 110, and anisotropic etching may be performed on the insulation layer so that the insulation liner 186 is left on a sidewall of the first opening portion 190H1. The insulation layer may be formed of, for example, an impurity-doped oxide, a low-k dielectric oxide, or a combination thereof. For example, the insulation layer may have a double-layered structure including an impurity-doped oxide and a low-k dielectric oxide such as SiOCN.

Figure 22:
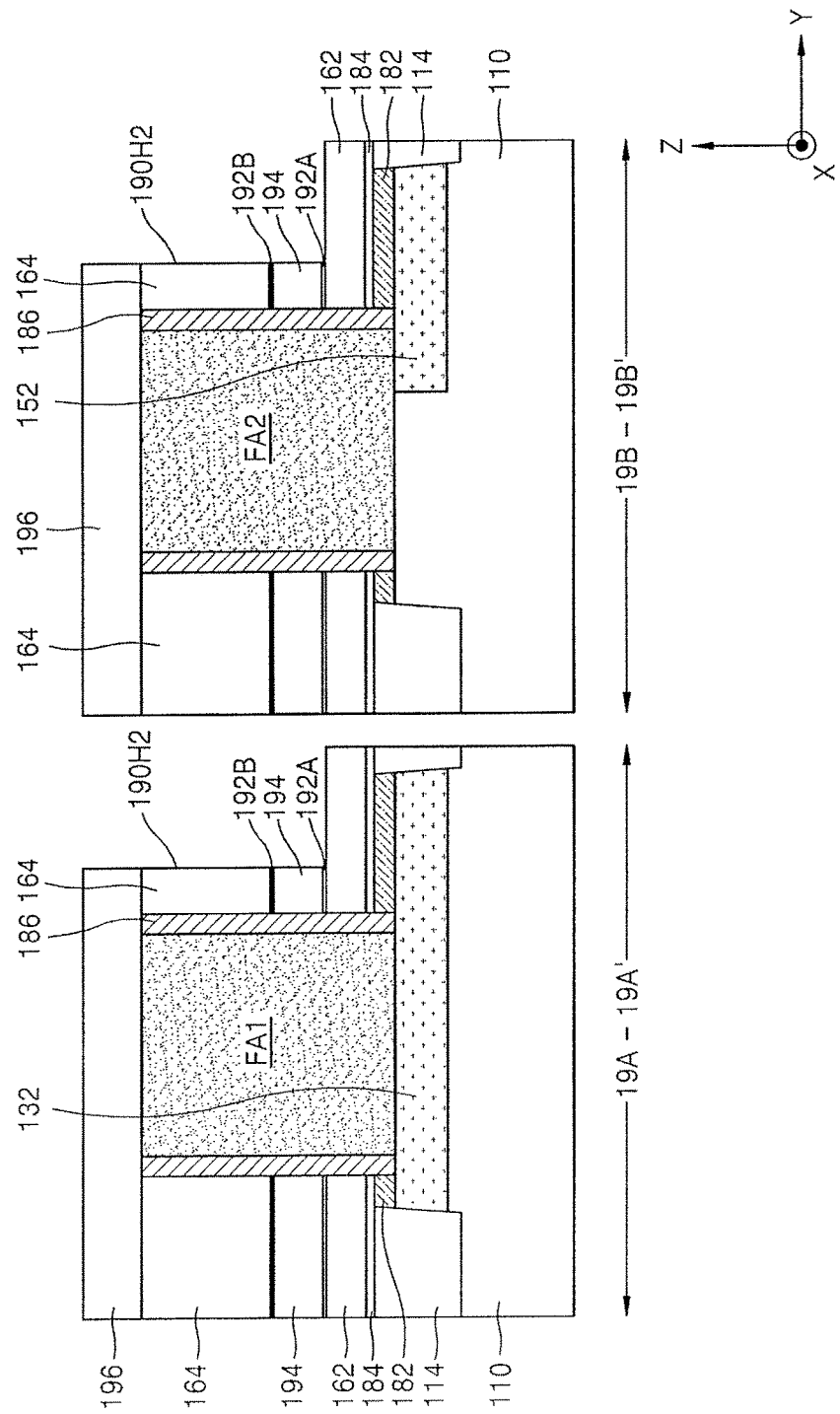

Referring to FIG. 22, a first fin active region FA1 and a second fin active region FA2 may be respectively formed in the first opening portions 190H1 (see FIG. 21) on the first region RX1 and the second region RX2.

In an example embodiment, a process of forming the first fin active region FA1 and the second fin active region FA2 may be a selective epitaxial growth (SEG) process.

Next, a protection layer 196 may be formed on the second insulation layer 164 and the first fin active region FA1 and the second fin active region FA2. The protection layer 196 may be formed of, for example, silicon oxide, silicon nitride, silicon oxynitride, carbon-containing oxynitride, or a combination thereof. By sequentially etching the mold structure 190 and the protection layer 196, a second opening portion 190H2 that exposes a top surface of the first insulation layer 162 may be formed.

Figure 23:
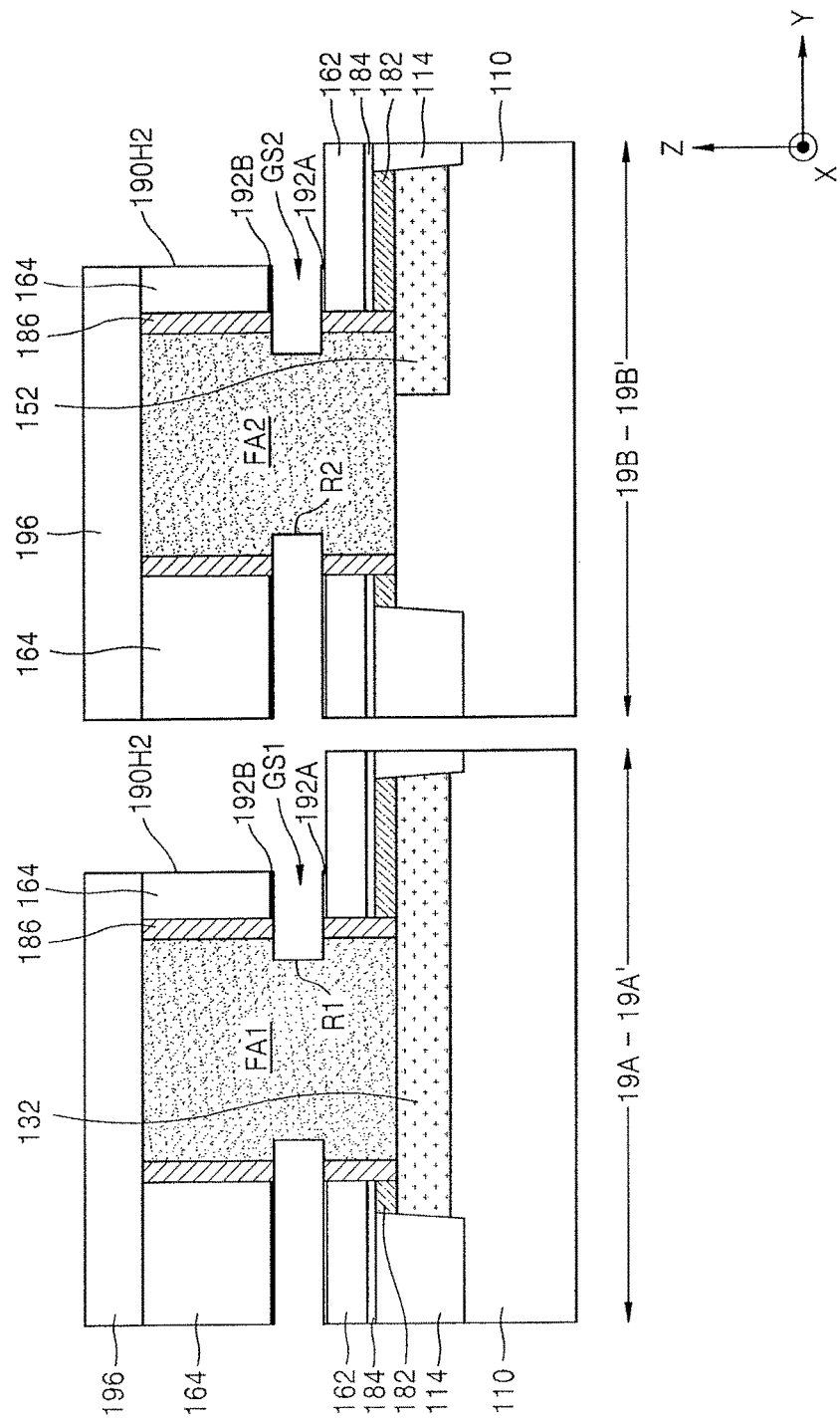

Referring to FIG. 23, a portion of the sacrificial layer 194 exposed through the second opening portion 190H2 may be removed to form gate spaces GS1 and GS2 in a portion from which the sacrificial layer 194 is removed. Side surfaces of the insulation liner 186 disposed on the sidewalls of the first and second fin active regions FA1 and FA2 may be exposed through the gate spaces GS1 and GS2.

In an example process for removing the sacrificial layer 194, a wet etching process may be performed using an etchant solution having a high etching selectivity with respect to the sacrificial layer 194, and accordingly, portions of the conductive liners 192A and 192B, the insulation liner 186, and the first and second insulation layers 162 and 164 may hardly be etched, but just the sacrificial layer 194 may be removed.

Next, a portion of the insulation liner 186 exposed through the gate spaces GS1 and GS2 may be further etched to expose side surfaces of the first and second fin active regions FA1 and FA2. Here, recesses R1 and R2 may be formed in sidewalls of the first and second fin active regions FA1 and FA2, respectively.

Figure 24:
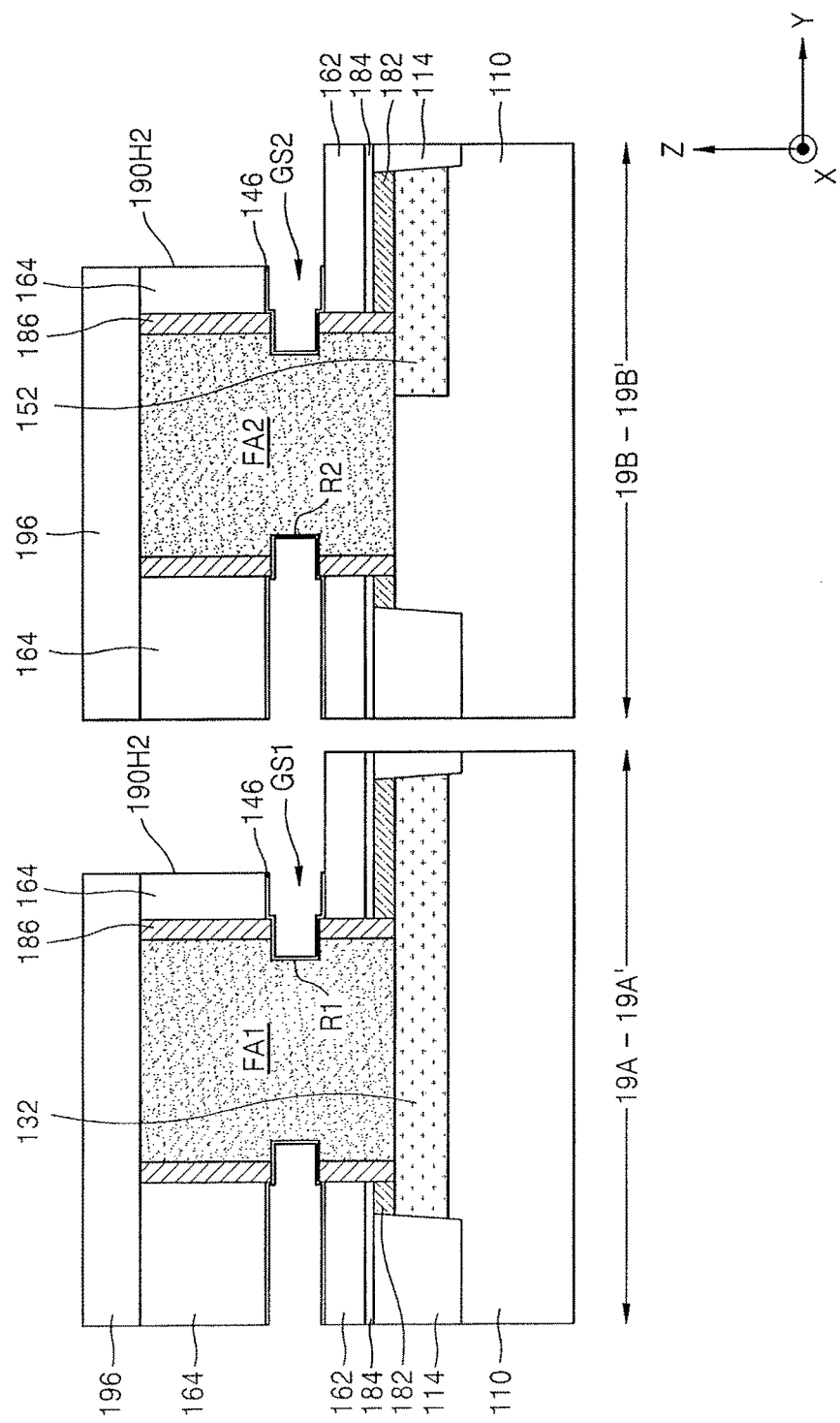

Referring to FIG. 24, an interface layer 146 may be formed on the sidewalls of the first and second fin active regions FA1 and FA2 exposed through the gate spaces GS1 and GS2. For example, by using a thermal oxidization process, the interface layer 146 may be formed on the sidewalls of the first and second fin active regions FA1 and FA2, and the conductive liners 192A and 192B exposed through the gate spaces GS1 and GS2 may also be turned into a portion of the interface layer 146 in the above thermal oxidization process. In another implementation, the interface layer 146 may also be formed on the sidewalls of the first and second fin active regions FA1 and FA2 and on the conductive liners 192A and 192B by using, for example, an ALD process or a CVD process or the like.

Figure 25:
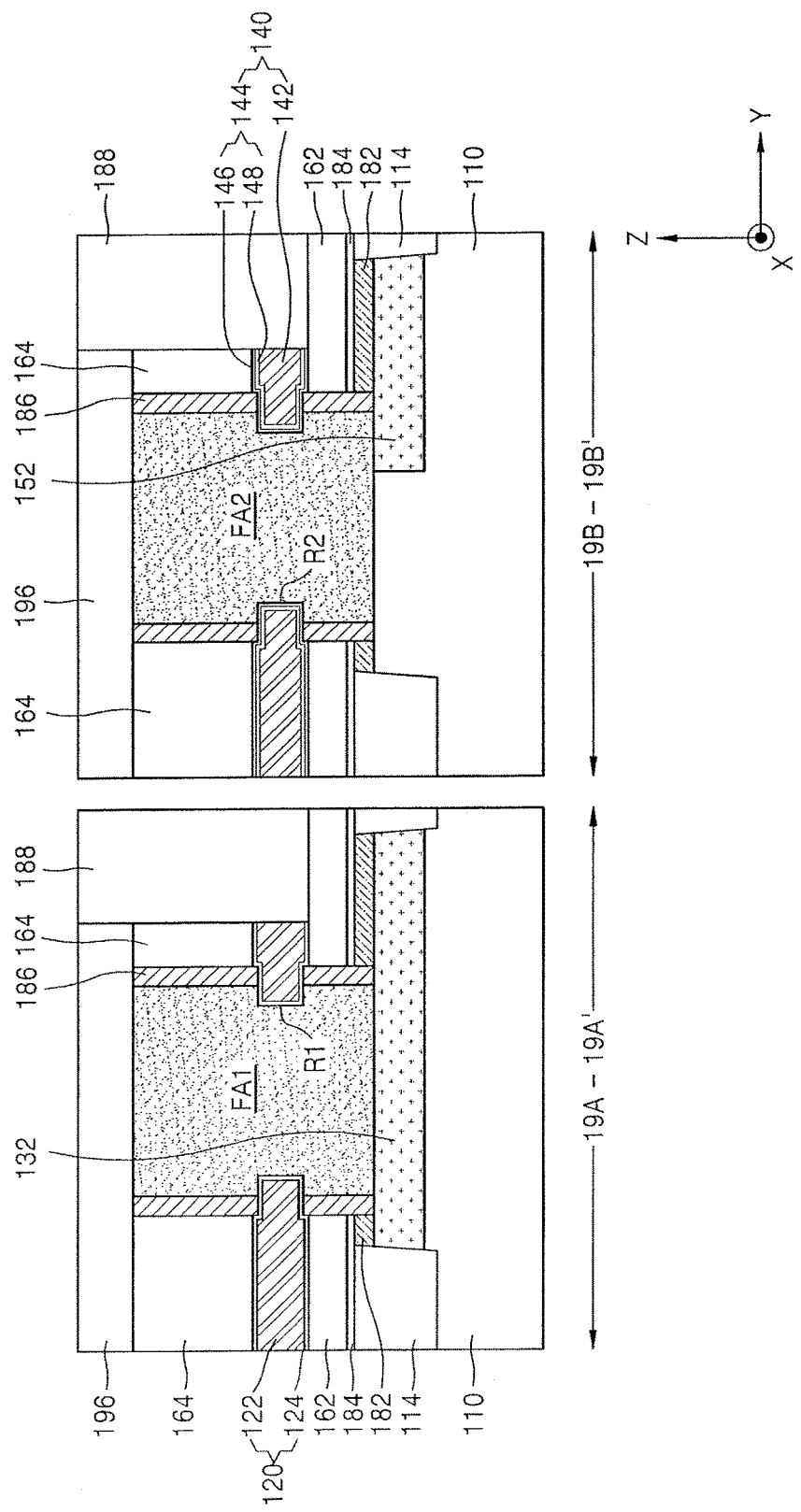

Referring to FIG. 25, after forming a mask on the second fin active region FA2, a portion of the interface layer 146 on the sidewall of the first fin active region FA1 may be removed. Accordingly, the interface layer 146 may remain only on the sidewall of the second fin active region FA2 and in the gate space GS2 exposing the sidewall of the second fin active region FA2 (see FIG. 24).

Next, the mask may be removed.

Next, a first gate insulation layer 124 and a high-k dielectric layer 148 may be formed on the first fin active region FA1 and the interface layer 146 respectively exposed through the gate spaces GS1 and GS2 (see FIG. 24) by using, for example, a process such as an ALD process or a CVD process. The interface layer 146 and the high-k dielectric layer 148 formed in the gate space GS2 may be referred to as a second gate insulation layer 144. The second gate insulation layer 144 may have a structure in which the interface layer 146 and the high-k dielectric layer 148 are stacked. Thus, the second gate insulation layer 144 may have a greater thickness than the first gate insulation layer 124.

Next, first and second gate electrodes 122 and 142 that respectively fill the gate spaces GS1 and GS2 may be formed. In an example embodiment, a conductive layer that fills the second opening portion 190H2 and the gate spaces GS1 and GS2 may be formed of, for example, a metal material such as titanium, titanium nitride, tantalum, tantalum nitride, or tungsten by using, for example, an ALD process or a CVD process, and the conductive layer may be etched back so that the first and second gate electrodes 122 and 142 are left in the gate spaces GS1 and GS2.

Next, an intergate insulation layer 188 that fills the second opening portion 190H2 may be formed. The intergate insulation layer 188 may be formed of, for example, silicon oxide, silicon nitride, silicon oxynitride, carbon-containing silicon oxynitride, or a combination thereof. For example, the intergate insulation layer 188 may include a layer such as a TEOS layer, a ULK layer having an ultra-low dielectric constant K of about 2.2 to about 2.4, for example, one of a SiOC layer and a SiCOH layer.

Figure 26:
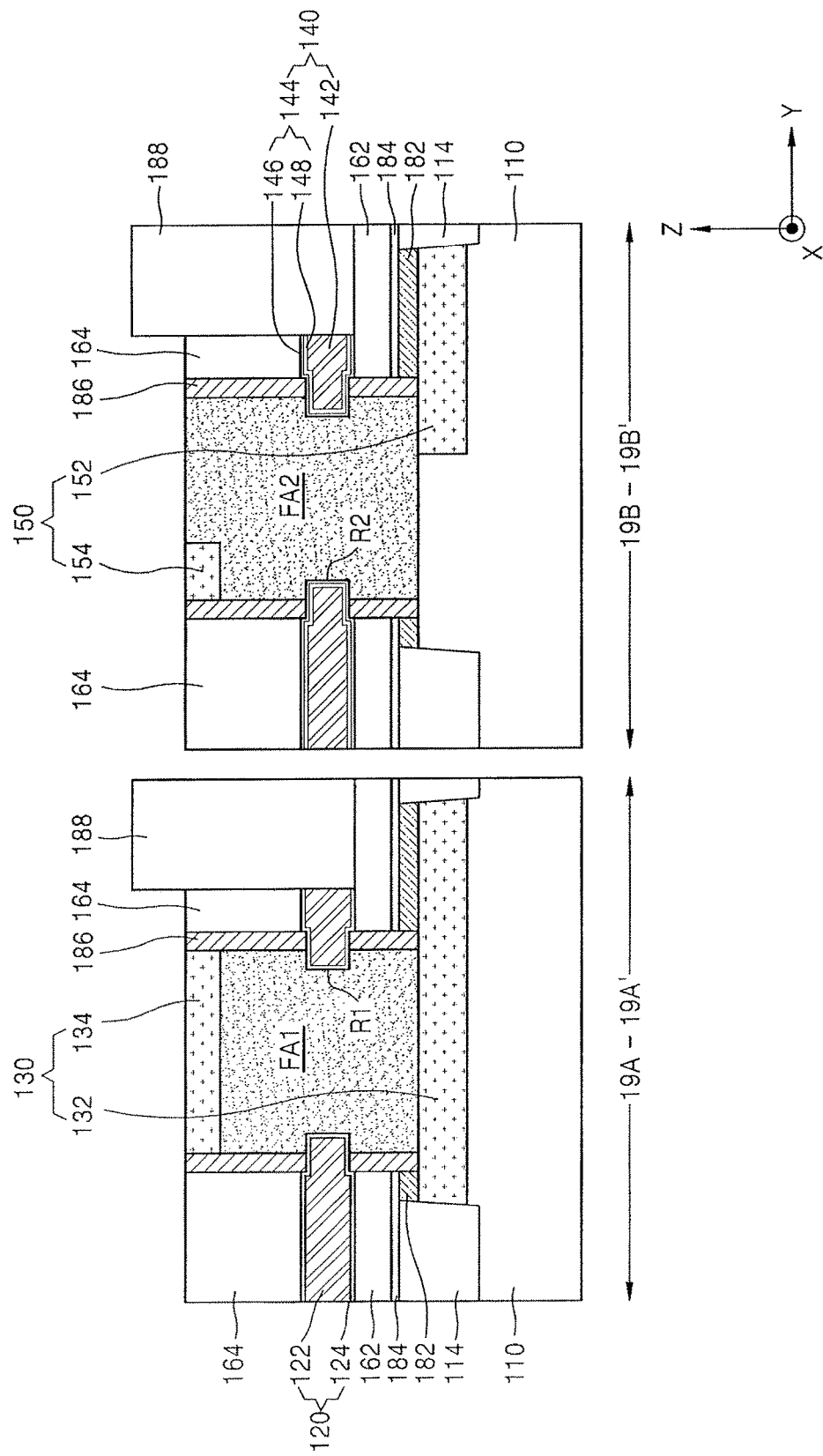

Referring to FIG. 26, the protection layer 196 (see FIG. 25) may be removed to expose top surfaces of the first and second fin active regions FA1 and FA2. A first top impurity region 134 and a second top impurity region 154 may be respectively formed on the first and second fin active regions FA1 and FA2 by ion-implanting a second impurity. For example, when an NMOS transistor is formed on the substrate 110, the second impurity may be n-type impurities. When a PMOS transistor is formed on the substrate 110, the second impurity may be p-type impurities.

The first top impurity region 134 may be formed to vertically overlap the entire area of the first fin active region FA1, and the second top impurity region 154 may be formed to vertically overlap a portion of the area of the second fin active region FA2. In addition, along an X-Y plane, the second top impurity region 154 may be formed in a side portion of the top portion of the second fin active region FA2 so as not to vertically overlap the second bottom impurity region 152 along an X-Y plane.

Referring to FIG. 19 again, the third insulation layer 166 may be formed on the first and second fin active regions FA1 and FA2, the second insulation layer 164, and the intergate insulation layer 188. Next, the top contacts TC1 and TC2 electrically connected to the top portions of the first and second fin active regions FA1 and FA2, the bottom contacts BC1 and BC2 electrically connected to the intermediate layer 182, and the gate contacts GC1 and GC2 electrically connected to the first and second gate electrodes 122 and 142 may be formed.

The integrated circuit device 100H may be completed by performing the above-described processes.

According to the manufacturing method described above, the first bottom impurity region 132 of the first transistor TR1 and the second bottom impurity region 152 of the second transistor TR2 may be formed in one ion-implantation process, and the first top impurity region 134 of the first transistor TR1 and the second top impurity region 154 of the second transistor TR2 may be formed in one ion-implantation process. Accordingly, the manufacturing process of the integrated circuit device 100 may be simplified. In addition, the interface layer 146 of the second gate structure 140 may be formed using a thermal oxidization process, and thus the first gate structure 120 of the first transistor TR1 and the second structure 140 of the second transistor TR2 may be formed in a simplified manufacturing process.

In general, when a gate-all-around transistor is used, manufacturing processes for forming a plurality of transistors including gate electrodes of different lengths and gate insulation layers of different thicknesses in a high-voltage region and a low-voltage region may be complicated. For example, when forming a gate-all-around transistor, a sacrificial layer may be removed, and the first and second gate structures may be formed in the gate spaces from which the sacrificial layer is removed. However, if the gate structures formed in the first and second regions have different heights (vertical thicknesses), a sacrificial layer having different thicknesses in the first region and the second region may be needed, and an additional process using an additional mask may thus be used to differentiate the vertical thickness of the sacrificial layer.

As described above, in an example embodiment, when the sacrificial layer 194 having a uniform vertical thickness is used in the first region RX1 and the second region RX2, that is, when the first and second gate structures 120 and 140 have the same vertical thickness, the first transistor TR1 and the second transistor TR2 may have different effective channel lengths. Thus, the integrated circuit device 100H having a low-voltage transistor and a high-voltage transistor at the same time may be obtained by using a simplified manufacturing process.

By way of summation and review, with the downscaling of semiconductor devices, a short channel effect may be generated in transistors, which may degrade the performance or reliability of the semiconductor devices. A semiconductor device having a multi-gate structure such as a gate-all-around transistor may be implemented order to reduce the short channel effect.

As described above, embodiments relate to an integrated circuit device including a gate-all-around transistor and a method of manufacturing the integrated circuit device. Embodiments may provide an integrated circuit device including transistors having different effective channel lengths, manufactured using a simplified manufacturing process. Embodiments also provide a method of manufacturing the integrated circuit device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   a fin active region on a substrate and extending in a first direction parallel to a top surface of the substrate;
   a gate structure on a side surface of the fin active region;
   a lower impurity region below a bottom portion of the fin active region, the lower impurity region being at a level lower than a lower surface of the gate structure; and
   an upper impurity region on a top portion of the fin active region, the upper impurity region being at a level higher than a top surface of the gate structure;
   wherein the upper impurity region and the lower impurity region does not overlap each other in a second direction perpendicular to the top surface of the substrate.

2. The integrated circuit device of claim 1, wherein the upper impurity region is spaced apart from the lower impurity region in the first direction and in the second direction.

3. The integrated circuit device of claim 1, further comprising an insulation layer on the gate structure and the fin active region, the insulation layer surrounding a sidewall of the upper impurity region.

4. The integrated circuit device of claim 3, wherein the insulation layer overlaps the lower impurity region in the second direction.

5. The integrated circuit device of claim 3, wherein a top surface of a portion of the fin active region is at a level lower than a level of a top surface of the upper impurity region, and the portion of the fin active region is below the insulation layer.

6. The integrated circuit device of claim 1, wherein;
   a horizontal cross-sectional area of the fin active region is larger than a horizontal cross-sectional area of the upper impurity region, and
   a horizontal cross-sectional area of the fin active region is larger than a horizontal cross-sectional area of the lower impurity region.

7. The integrated circuit device of claim 1, wherein the fin active region, the lower impurity region, and the upper impurity region include an epitaxial semiconductor layer.

8. An integrated circuit device, comprising:
   a fin active region on a substrate and extending in a first direction parallel to a top surface of the substrate;
   a gate structure on a side surface of the fin active region;
   a lower impurity region below a bottom portion of the fin active region, the lower impurity region being at a level lower than a lower surface of the gate structure;
   an upper impurity region on a portion of a top surface of the fin active region, the upper impurity region being at a level higher than a top surface of the gate structure; and
   an insulation layer on the gate structure and a portion of the top surface of the fin active region, the insulation layer surrounding a sidewall of the upper impurity region,
   wherein the upper impurity region and the lower impurity region does not overlap each other in a second direction perpendicular to the top surface of the substrate.

9. The integrated circuit device of claim 8, wherein the upper impurity region is spaced apart from the lower impurity region in the first direction and in the second direction.

10. The integrated circuit device of claim 8, wherein the insulation layer overlaps the lower impurity region in the second direction.

11. The integrated circuit device of claim 8, wherein:
    the insulation layer contacts the top surface of the fin active region, and
    the insulation layer surrounds a sidewall of the fin active region.

12. The integrated circuit device of claim 8, wherein a top surface of a portion of the fin active region is at a level lower than a level of a top surface of the upper impurity region, and the portion of the fin active region is below the insulation layer.

13. The integrated circuit device of claim 8, wherein the fin active region, the lower impurity region, and the upper impurity region include an epitaxial semiconductor layer.

14. An integrated circuit device, comprising:
first and second fin active regions on a substrate and extending in a first direction parallel to a top surface of the substrate;
a first gate structure on a side surface of the first fin active region;
a first lower impurity region below a bottom portion of the first fin active region, the first lower impurity region being at a level lower than a lower surface of the first gate structure; and
a first upper impurity region on a top surface of the first fin active region, the first upper impurity region being at a level higher than a top surface of the first gate structure;
a second gate structure on a side surface of the second fin active region;
a second lower impurity region below a portion of a bottom portion of the second fin active region, the second lower impurity region being at a level lower than a lower surface of the second gate structure; and
a second upper impurity region on a portion of a top surface of the second fin active region, the second upper impurity region being at a level higher than a top surface of the second gate structure, the second upper impurity region not vertically overlapping the second lower impurity region,
wherein the second fin active region, the second lower impurity region, and the second upper impurity region include an epitaxial semiconductor layer.

15. The integrated circuit device of claim 14, wherein the first upper impurity region vertically overlaps the first lower impurity region.

16. The integrated circuit device of claim 14, further comprising an insulation layer on the second gate structure, the insulation layer surrounding a sidewall of the second upper impurity region.

17. The integrated circuit device of claim 16, wherein:
the insulation layer is on the top surface of the second fin active region, and
the insulation layer vertically overlaps the second lower impurity region.

18. The integrated circuit device of claim 14, wherein a second effective channel length formed in the second fin active region between the second upper impurity region and the second lower impurity region is longer than a first effective channel length formed in the first fin active region between the first upper impurity region and the first lower impurity region.

19. The integrated circuit device of claim 14, wherein a horizontal cross-sectional area of the second upper impurity region is smaller than a horizontal cross-sectional area of the first upper impurity region.

20. The integrated circuit device of claim 14, wherein a distance between the second upper impurity region and the second lower impurity region is greater than a distance between the first upper impurity region and the first lower impurity region.

* * * * *